United States Patent [19]

Miyazawa et al.

[11] Patent Number: 5,243,213
[45] Date of Patent: Sep. 7, 1993

[54] MIS SEMICONDUCTOR DEVICE FORMED BY UTILIZING SOI SUBSTRATE HAVING A SEMICONDUCTOR THIN FILM FORMED ON A SUBSTRATE THROUGH AN INSULATING LAYER

[75] Inventors: Yoshihiro Miyazawa, Kanagawa; Eric Minami, Tokyo; Takeshi Matsushita, Kanagawa, all of Japan

[73] Assignee: Sony Corporation, Tokyo, Japan

[21] Appl. No.: 726,904

[22] Filed: Jul. 8, 1991

[30] Foreign Application Priority Data

Jul. 9, 1990 [JP] Japan ................... 2-180898
Jul. 9, 1990 [JP] Japan ................... 2-180899

[51] Int. Cl.$^5$ .................. H01L 29/78; H01L 27/02
[52] U.S. Cl. ................... 257/350; 257/413; 257/768; 257/770; 257/928; 257/378
[58] Field of Search .............. 357/23.7, 49, 86; 257/347, 350, 352, 396, 507, 524, 928

[56] References Cited

U.S. PATENT DOCUMENTS 4,371,955 2/1983 Sasaki .................. 357/23.7
4,879,585 11/1989 Usami .................. 357/23.7

Primary Examiner—Gene M. Munson
Attorney, Agent, or Firm—Hill, Steadman & Simpson

[57] ABSTRACT

The present invention is directed to a MIS semiconductor device having a semiconductor layer formed on an insulating substrate and a gate electrode formed on this semiconductor layer through a gate insulating film, which is provided with a semiconductor region of a second conductivity type or a metal layer formed adjacent to a source region of a first conductivity type but separated from a channel region, thereby suppressing degradation of breakdown voltage caused by impact ionization, which is a defect of the MIS semiconductor device formed on an SOI substrate, to improve the reliability of this kind of MIS semiconductor devices.

5 Claims, 32 Drawing Sheets

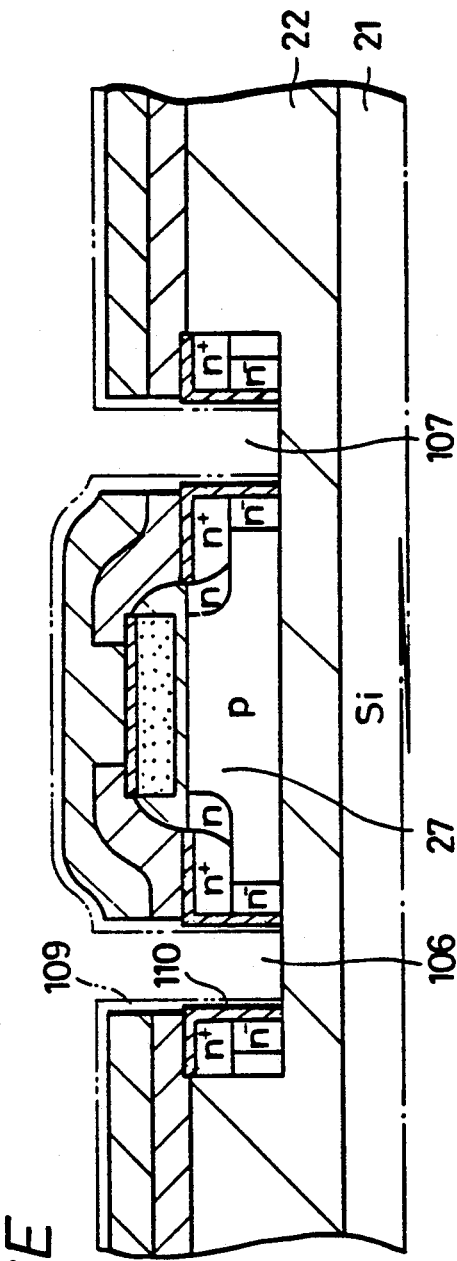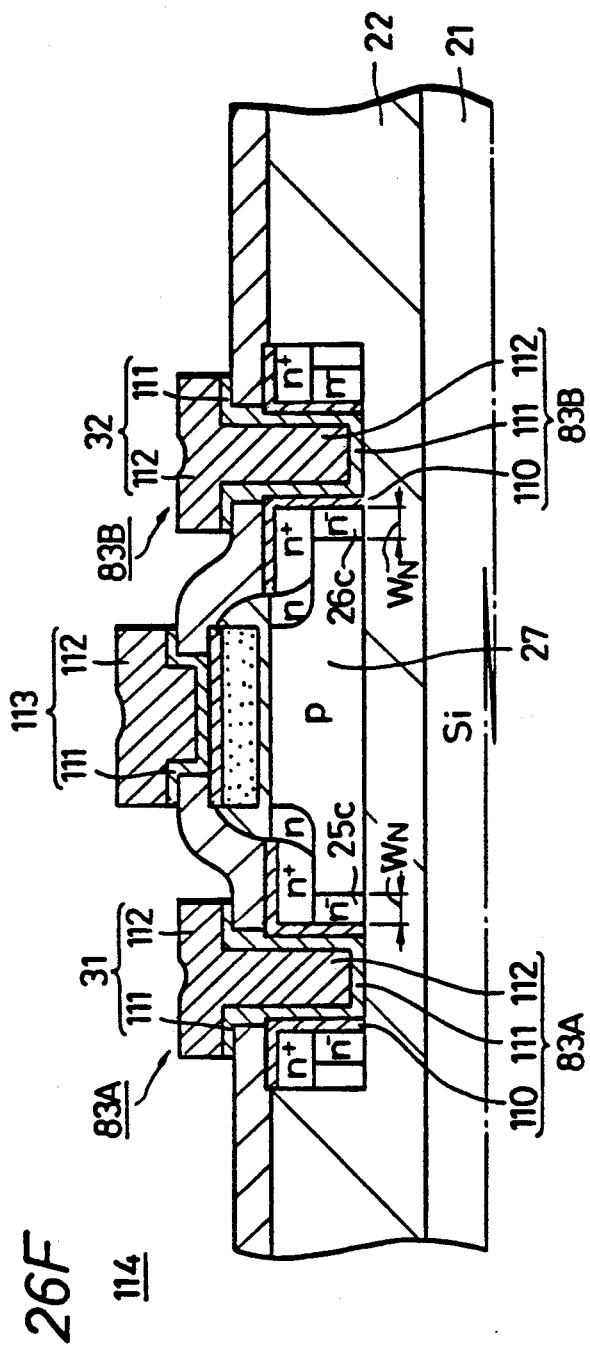

MIS SEMICONDUCTOR DEVICE FORMED BY UTILIZING SOI SUBSTRATE HAVING A SEMICONDUCTOR THIN FILM FORMED ON A SUBSTRATE THROUGH AN INSULATING LAYER

BACKGROUND OF THE INVENTION

1. Field of the Invention

The present invention relates to a MIS semiconductor device which is formed by utilizing a so-called SOI (silicon on insulator) substrate having a semiconductor thin film formed on a substrate through an insulating layer and forming a MIS structure semiconductor element on the semiconductor thin film.

2. Description of the Prior Art

Recently, many advantages have been reported with respect to a so-called thin-film SOI element utilizing an SOI substrate. This element has advantages, for example, of having a high freedom in setting an impurity concentration in a channel region, having a high durability against the α ray, requiring no latchup, enabling a high speed operation by virtue of a decrease of parasitic capacitance between the substrate and a silicon thin film constituting an element forming region and so on.

For this reason, research and development on the thin film SOI element are extensively being progressed. A MIS field effect transistor (hereinafter simply referred to as "MISFET") utilizing the SOI substrate, by way of example, employs an SOI substrate 4 formed with an insular silicon thin film (so-called SOI film) 3 through an $SiO_2$ layer 2 on a silicon substrate 1, for example, by adhesion or the like, forms a first conductivity type source region 5, a drain region 6 in the silicon thin film 3, and a gate electrode 8 made of a polycrystalline silicon on the silicon thin film 3 between the source region 5 and the drain region 6 through a gate insulating film 7 made, for example, of $SiO_2$ or the like as shown in FIG. 1. In FIG. 1, reference numeral 9 designates a source electrode and 10 a drain electrode.

A MISFET 11 utilizing the SOI substrate 4 shown in FIG. 1, however, has a defect that the source-drain breakdown voltage, that is, a tolerance against voltage between the source and the drain is low. This defect is caused in a manner that, as shown in FIG. 1, the minority carrier (electron) e injected into a channel region 12 from the source region 5 flows toward the drain region 6 in the MISFET 11, this electron e gives rise to impact ionization in a high electric field region 13 produced at the end of the drain beneath the gate electrode 8, electron-hole pairs are consequently generated, and the positive hole h thereof flows into the channel region 12. That is, in an ordinary bulk-type MISFET, the positive hole h flowing into the channel region (so-called hole current $I_p$) is released through the substrate as a substrate current, whereas the SOI substrate is constructed in a manner that the silicon thin film 3 is surrounded by the $SiO_2$ layer 2 which prevents the positive hole h from being released, so that the above positive hole h is accumulated in the channel region 12 in the vicinity of the source region 5. The accumulated positive hole h gives rise to reducing the height of the energy barrier between the source and the channel, whereby the source acts as the emitter for the electron to generate an electron current $I_n$, by the bipolar operation, in addition to the normal electron flowing (channel current $I_o$) through the channel region 12. This electron current $I_n$ leads to a positive feedback phenomenon, wherein the hole current $I_p$ is again generated in the high electric field region 13, to thereby suddenly increase a drain current $I_p$, which results in decreasing the breakdown voltage between the source and the drain.

There have conventionally been proposed a variety of methods for suppressing the degradation of the breakdown voltage between the source and the drain caused by the impact ionization.

For example, an MISFET 14 shown in FIG. 2 provides a larger thickness at a portion of a silicon film 3 corresponding to a drain region 6 to decrease the electric field at the end of the drain, thereby reducing the occurrence of a hole current due to the impact ionization and improving the breakdown voltage between the source and the drain. However, this method is inconvenient in that the structure is complicated and difficult to manufacture, and sufficient effects cannot be produced. An MISFET 15 shown in FIG. 3, on the other hand, forms a source region 5 and a drain region 6 thinner than the thickness of a silicon thin film 3, a semiconductor region 16 in the same conductivity type as the channel region 12 outside the source region 5 and separated from the source region 5, and an electrode 17 led from the semiconductor region, thereby releasing the positive hole h produced by the impact ionization through the semiconductor region 17 to improve the breakdown voltage between the source and the drain. Since this method requires a large area of the silicon thin film 3 for forming the semiconductor region 16, a parasitic capacitance between the region 12 on the substrate and the drain region 12 is increased, thereby losing an advantage of the MISFET utilizing the SOI substrate. Further, the thickness of the silicon thin film 3 is substantially increased so that a short channel effect is readily produced. For preventing the short channel effect, it is necessary to make the channel concentration higher, which results in losing an advantage of the MISFET utilizing the SOI substrate that the carrier mobility can be enhanced.

Further, a MIS constructed as shown in FIG. 4 has been proposed, regarded as being rational from the viewpoint of the manufacturing process and the structure. In the MISFET 18 shown in FIG. 4, a semiconductor region 16 of the same conductivity type as a channel region 12 is formed outside and adjacent to a shallow source region 5, and a source electrode 9 is used in common, thereby making it possible to use the MISFET as an ordinary three-terminal element. The MISFET 18 can also release the positive hole h produced by the impact ionization through the semiconductor region 16 and the source electrode 9 to improve the drain breakdown voltage. However, if a semiconductor region 19 of the same conductivity type as the semiconductor region 16 is also formed outside a drain region 6 in consideration of a symmetric element structure of the MISFET 18, as shown in FIG. 5, the positive holes h oozing from the semiconductor region 19 to the channel region 12 flows into the semiconductor region 16 on the side of the source region 5 (indicated by a hole current $I_p$ in FIG. 5), which causes an inconvenience of short-circuiting and consequently conducting between the source and the drain, for example, in a non-operative condition. It is therefore impossible to apply this structure to a switching element such as an access transistor for a static RAM (random access memory) cell which properly uses the source and the drain alternately, whereby an applicable range is limited as a circuit element.

OBJECTS AND SUMMARY OF THE INVENTION

Accordingly, it is an object of the present invention to provide an improved MIS-type semiconductor device in which the aforementioned shortcomings and disadvantages encountered with the prior art can be substantially eliminated.

More specifically, it is an object of the present invention to provide a MIS semiconductor device in which degradation of breakdown voltage due to the impact ionization can be suppressed to thereby improve reliability of the semiconductor device itself.

It is another object of the present invention to provide an MIS-type semiconductor device which can be applied to a wider variety of fields as a circuit element.

As a first aspect of the present invention, a MIS semiconductor device having a semiconductor layer formed on an insulating substrate and a gate electrode formed on the semiconductor layer through a gate insulating film is comprised of a semiconductor region of a second conductivity type formed adjacent to a source region of a first conductivity type so as to be separated from a channel region.

As a second aspect of the present invention, a MIS semiconductor device having a semiconductor layer formed on an insulating substrate and a gate electrode formed on the semiconductor layer through a gate insulating film is comprised of a source region of a first conductivity type having a high concentration region and a low concentration region beneath the high concentration region and a semiconductor region of a second conductivity type formed adjacent to the low concentration region and the high concentration region of the first conductivity type source region but separated from a channel region.

As a third aspect of the present invention, a MIS semiconductor device having a semiconductor layer formed on an insulating substrate 22, and a gate electrode is formed on the semiconductor layer through a gate insulating film is comprised of a semiconductor region of a second conductivity type formed adjacent to a drain region of a first conductivity type but separated from a channel region.

As a fourth aspect of the present invention, a MIS semiconductor device having a semiconductor layer formed on an insulating substrate and a gate electrode formed on the semiconductor layer through a gate insulating film is comprised of a metal layer formed adjacent to a source region but separated from a channel region.

As a fifth aspect of the present invention, a MIS semiconductor device having a semiconductor layer formed on an insulating substrate and a gate electrode formed on the semiconductor layer through a gate insulating film is comprised of a source region having a high concentration region and a low concentration region beneath the high concentration region and a metal layer formed adjacent to the low concentration region and the high concentration region of the source region but separated from a channel region.

As a sixth aspect of the present invention, a MIS semiconductor device having a semiconductor layer formed on an insulating substrate, and a gate electrode is formed on the semiconductor layer through a gate insulating film is comprised of a Schottky junction formed adjacent to a drain region and a metal layer separated from a channel region.

According to the first invention, the second conductivity type semiconductor region separated from the channel region is provided adjacent to the first conductivity type source region, wherein the distance (width) $W_N$ of the source region between the second conductivity type semiconductor region and the channel region is made shorter than the diffusion length $L_p$ of the minority carrier in the source region to thereby reduce the effective diffusion length of the minority carrier in the source region. Simultaneously, a bipolar transistor structure is formed by the second conductivity type channel region, the first conductivity type source region and the second conductivity type semiconductor region. Accordingly, if this second conductivity type semiconductor region is applied with a predetermined potential voltage or if the second conductivity type semiconductor region and the source region are connected in common, the channel region, the source region and the second conductivity type semiconductor region act as a bipolar transistor, thereby making it possible to release a minority carrier current (e.g., a hole current if an n-channel MISFET is concerned) generated in the channel region due to the impact ionization through the first conductivity type source region and the second conductivity type semiconductor region.

Therefore it is possible to prevent the degradation of the breakdown voltage between the source and the drain while maintaining the advantages of the MISFET utilizing the SOI substrate as well as inhibit shortcircuit and conduction when the element structure is made symmetric, which results in improving the reliability of the semiconductor device and enhancing an applicable range as a circuit element.

According to the second invention, the high concentration region and the low concentration region therebeneath are formed as the first conductivity type source region, and the second conductivity type semiconductor region is provided adjacent to the low concentration region and the high concentration region but separated from the channel region, whereby the effective diffusion length of the minority carrier in the low concentration region of the source region is reduced in a manner similar to the first invention. Also, the second conductivity type channel region, the low concentration region of the first conductivity type source region and the second conductivity type semiconductor region act as a bipolar transistor, thereby making it possible to release a minority carrier current generated in the channel region due to the impact ionization through the low concentration region of the source region and the second conductivity type semiconductor region. Further, the provision of the low concentration region allows the minority carrier current generated in the channel region due to the impact ionization to flow more easily into the second conductivity type semiconductor region, thereby further improving the breakdown voltage between the source and the drain. Therefore, it is possible to prevent the degradation of the breakdown voltage between the source and the drain while maintaining the advantages of the MISFET utilizing the SOI substrate and also inhibit shortcircuit and conduction when the element structure is made symmetric, thereby making it possible to improve the reliability of the semiconductor device and extend an applicable range as circuit elements.

Further, according to the third invention, the second conductivity type semiconductor region separated from the channel region is formed adjacent to the first conductivity type drain region close to the source of electron-hole pairs generated by the impact ionization, and the potential of the semiconductor region is made equal to the source potential or in the vicinity thereof, whereby a minority carrier current generated by the impact ionization can be released through the second conductivity type semiconductor region from the drain region. Therefore, it is possible to prevent the degradation of the breakdown voltage between the source and the drain while maintaining the advantages of the MISFET utilizing the SOI substrate.

According to the fourth invention, the metal layer separated from the channel region is provided adjacent to the source region in the semiconductor layer, whereby a distance (width) $W_N$ of the source region between the metal layer and the channel region is made shorter than a diffusion length $L_p$ of the minority carrier in the source region to thereby reduce the effective diffusion length of the minority carrier in the source region, thereby making it possible to release a minority carrier current (e.g., a hole current if an n-channel MISFET is concerned) generated in the channel region due to the impact ionization through the source region and the metal layer. When a Schottky junction is formed between the metal layer and the source region, the hole current flowing to the metal layer is further increased by an electric field prevailing in the interface therebetween. Therefore, it is possible to prevent the degradation of the breakdown voltage between the source and the drain while maintaining advantages of the MISFET utilizing the SOI substrate and inhibiting shortcircuit and conduction when the element structure is made symmetric, which results in improving the reliability of the semiconductor device itself and enhancing an applicable range as a circuit element.

According to the fifth invention, the high concentration region and the low concentration region therebeneath are formed as a source region, and the metal layer is provided in the semiconductor layer adjacent to the low concentration region and the high concentration region constituting the source region but separated from the channel region, whereby a Schottky junction is formed between the metal layer and the low concentration region while an ohmic contact is formed between the metal layer and the high concentration region. Also in this case, by virtue of the metal layer, the distance (width) $W_N$ of the low concentration region between the metal layer and the channel region is made shorter than the diffusion length $L_p$ of the minority carrier in the low concentration region, whereby a so-called bipolar transistor operation is performed by the metal layer, the low concentration region and the channel region (i.e., a drift electric field caused by the Schottky junction is added) releases a minority carrier current generated in the channel region due to the impact ionization through the low concentration region and the metal layer, to thereby prevent the degradation of the breakdown voltage between the source and the drain. Also, it is possible to make the element structure symmetric, thereby improving the reliability of the device and extending an applicable range as a circuit element.

Further, according to the sixth invention, the metal layer which forms a Schottky junction with the drain region and which is separated from the channel region is formed on the side of the drain region close to the source of electron-hole pairs generated by the impact ionization, and the potential of the metal layer is made equal to the source potential or in the vicinity thereof, whereby a minority carrier current generated by the impact ionization can be released through the metal layer from the drain region. Therefore, it is possible to prevent the degradation of the breakdown voltage between the source and the drain while maintaining advantages of the MISFET utilizing the SOI substrate.

The above and other objects, features, and advantages of the present invention will become apparent from the following detailed description of illustrative embodiments thereof to be read in conjunction with the accompanying drawings, in which like reference numerals are used to identify the same or similar parts in the several views.

BRIEF DESCRIPTION OF THE DRAWINGS

FIGS. 26A to 26F are schematic diagrams to which references will be made in explaining a manufacturing-process of a twenty-first embodiment of the MIS semiconductor device according to the present invention, respectively;

DETAILED DESCRIPTION OF THE PREFERRED EMBODIMENTS

The present invention will now be described with reference to the drawings. While the present invention is applied to an n-channel MISFET in respective embodiments, the present invention can of course be also applied to a p-channel MISFET.

Figure 6:
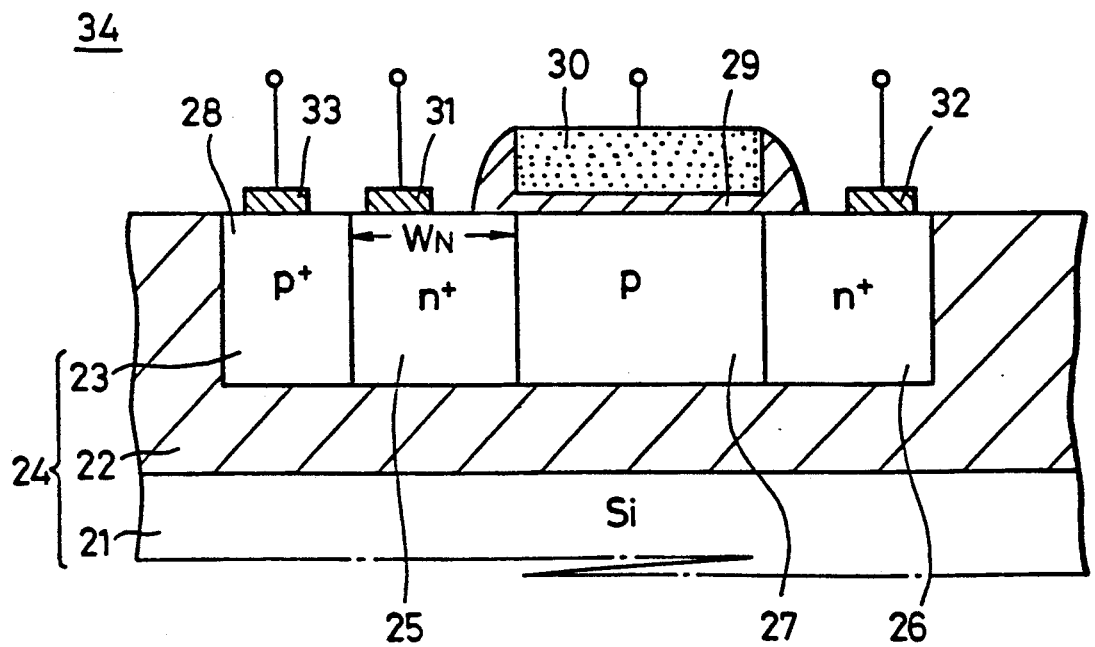
FIG. 6 is a schematic diagram showing a structure of a first embodiment of a MIS semiconductor device according to the present invention.

FIG. 6 shows a first embodiment of the present invention which employs an SOI substrate 24 comprising a silicon thin film 23 insulatively formed on a silicon substrate 21 through an $SiO_2$ film 22 in an insular shape. In the silicon thin film comprised in the SOI substrate 24, that is, the p-type silicon thin film 23, there is formed first conductivity type or n-type source region 25 and drain region 26 so as to reach the $SiO_2$ film 22 on its bottom. A p-type region 28 whose conductivity type is opposite to that of the source region 25, is also formed outside the source region 25 such that it becomes adjacent to the source region 25 but separated from a channel region 27. The distance (width) $W_N$ of the source region 25 between the p-type region 28 and the channel region 27 is selected to be shorter than the diffusion length $L_p$ of the minority carrier or positive holes in the source region 25. On the channel region 27 between the source region 25 and the drain region 26, there is formed a gate electrode 30 made of, for example, polycrystalline silicon, through a gate insulating film 29 made of, for example, $SiO_2$ or the like. Then, a source electrode 31, a drain electrode 32 and a lead-out electrode 33 are formed on the source region 25, the drain region 26 and the p-type region 28, respectively, to constitute an n-channel MISFET 34.

Figure 7:
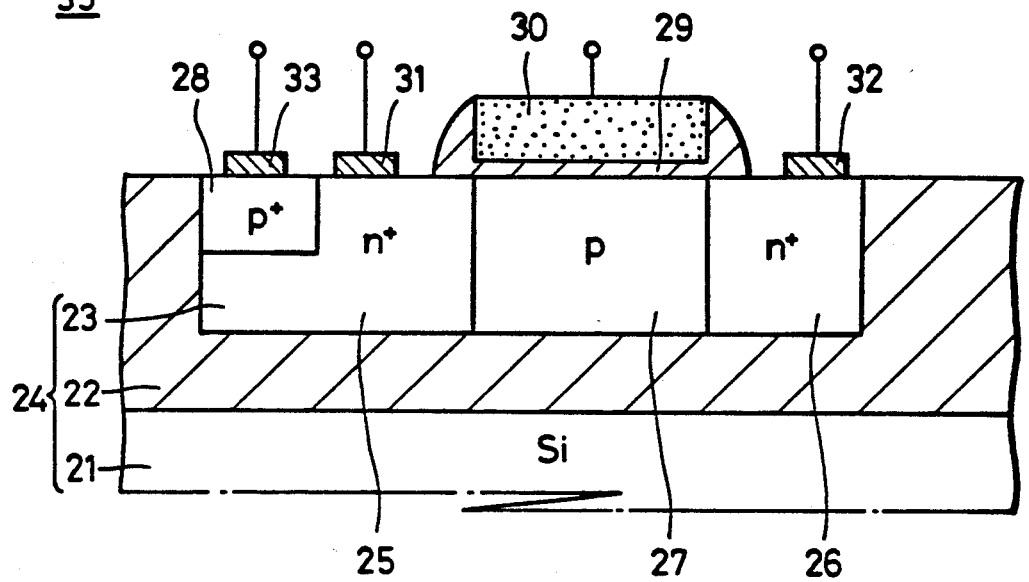
FIG. 7 is a schematic diagram showing a structure of a second embodiment (i.e., modified example of the first embodiment) of the MIS semiconductor device according to the present invention.
Figure 8:
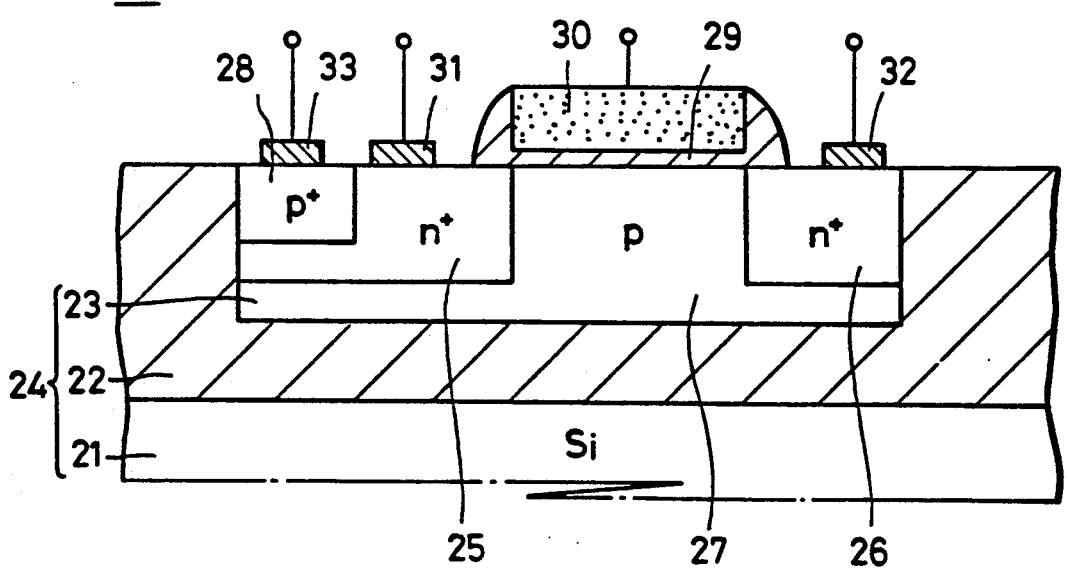
FIG. 8 is a schematic diagram showing a structure of a third embodiment (i.e., modified example of the first embodiment) of the MIS semiconductor device according to the present invention.
Figure 9:
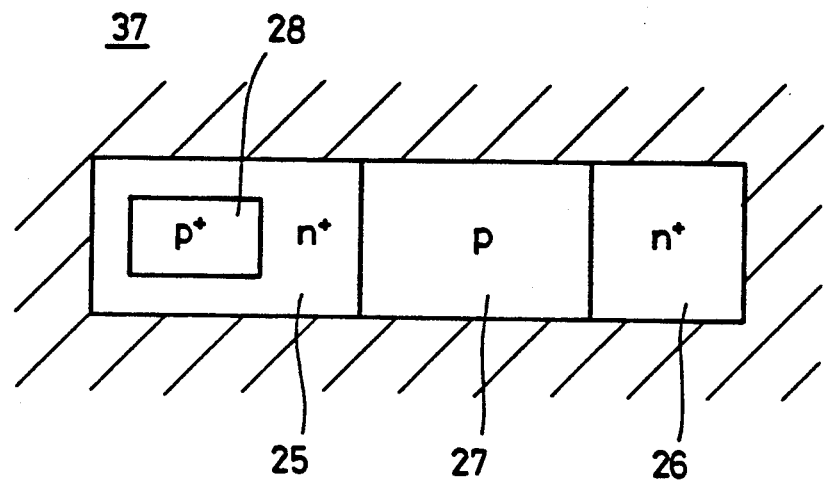
FIG. 9 is a schematic diagram showing a structure of a fourth embodiment (i.e., modified example of the first embodiment) of the MIS semiconductor device according to the present invention.

FIGS. 7 to 9 show other embodiments of the invention which are respectively modified examples of FIG. 6. As shown in FIG. 7, the n-type source region 25 and the drain region 26 are formed so as to reach the $SiO_2$ film 22 on the bottom of the film 23 and the p-type region 28 is formed in the n-type source region 25. As shown in FIG. 8, the n-type source region 25 and drain region 26 are formed up to a depth which does not reach the $SiO_2$ film 22 on the bottom of the film 23, and the p-type region 28 is formed in the n-type source region 25. Further, as shown in FIG. 9, the p-type region 28 is formed in a portion of the n-type source region 25 from a plain view standpoint.

The lead-out electrode 33 on the p-type region 28 of the respective MISFETs 34 to 37 shown in FIGS. 6 through 9 is applied with a predetermined voltage, for example, a ground voltage.

According to the structure described above, the p-type region 28 is provided adjacent to the n-type source region 25 so as to be separated from the p-type channel region 27, whereby a pnp bipolar transistor structure is formed by the p-type channel region 27, the n-type source region 25 and the p-type region 28 serving as the emitter, the base and the collector, respectively. By this structure, holes h (hole current $I_p$) or the minority carrier generated by the impact ionization occurring at the end of the drain region are released from the channel region 27 through the source region 25 and the p-type region 28 to the electrode 33, thereby making it possible to suppress the degradation of the breakdown voltage between the source and the drain due to the impact ionization.

While the MISFET devices are four-terminal elements in the above-described embodiments, they can be used as three-terminal elements by connecting the source region 25 and the p-type region 28 with an electrode metal or the like outside the device.

Figure 1:
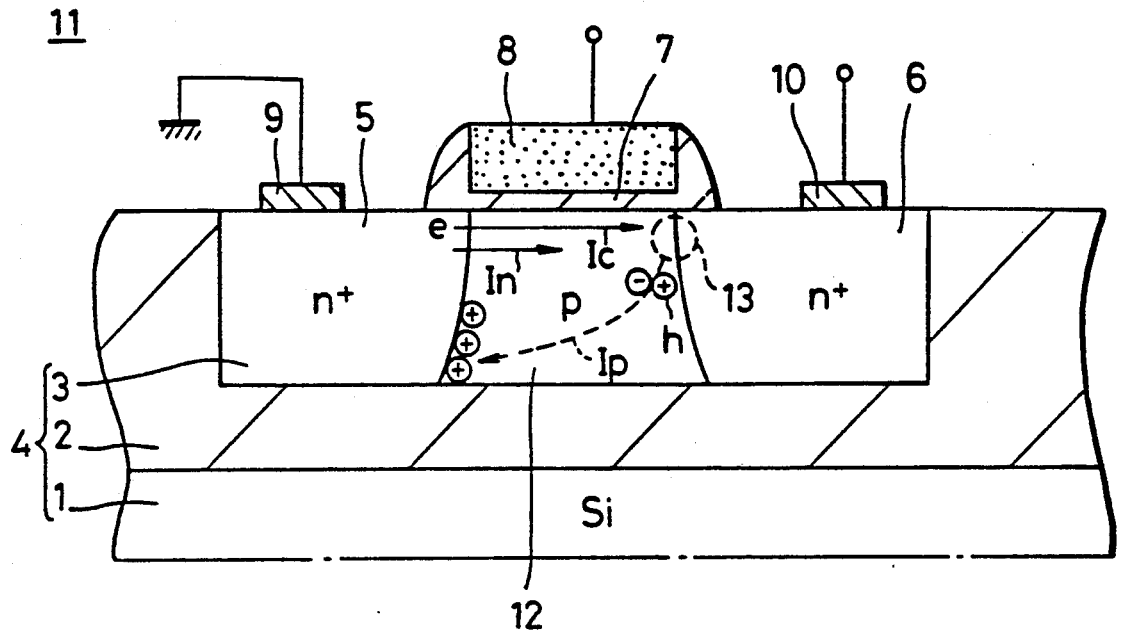
FIG. 1 is a schematic diagram showing a structure of a first example of a MIS semiconductor device according to the prior art.
Figure 2:
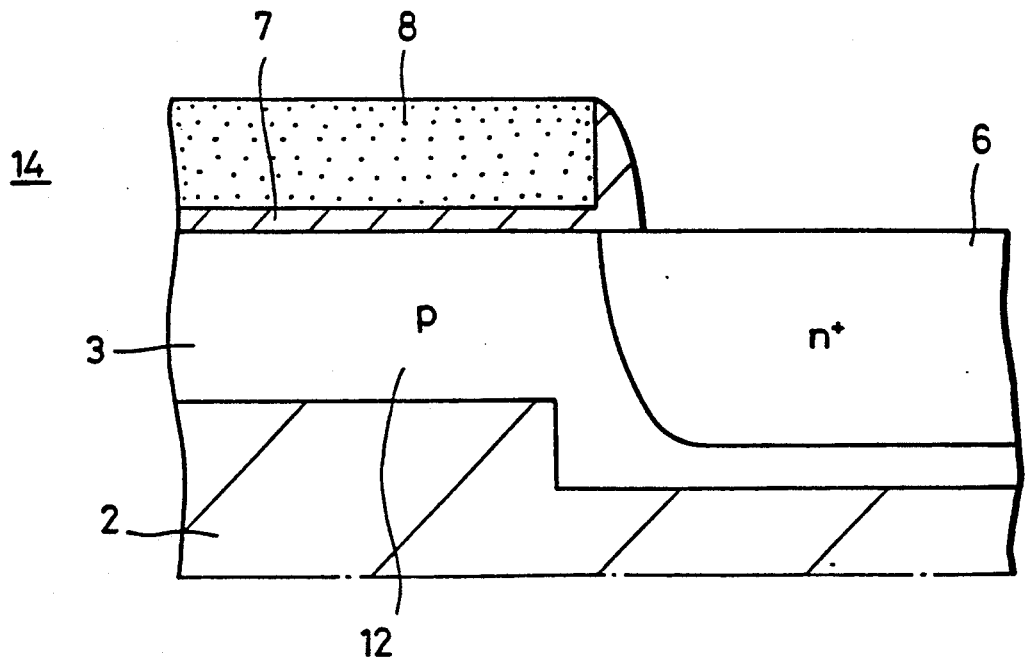
FIG. 2 is a schematic diagram showing a structure of a second example of the MIS semiconductor device according to the prior art.
Figure 3:
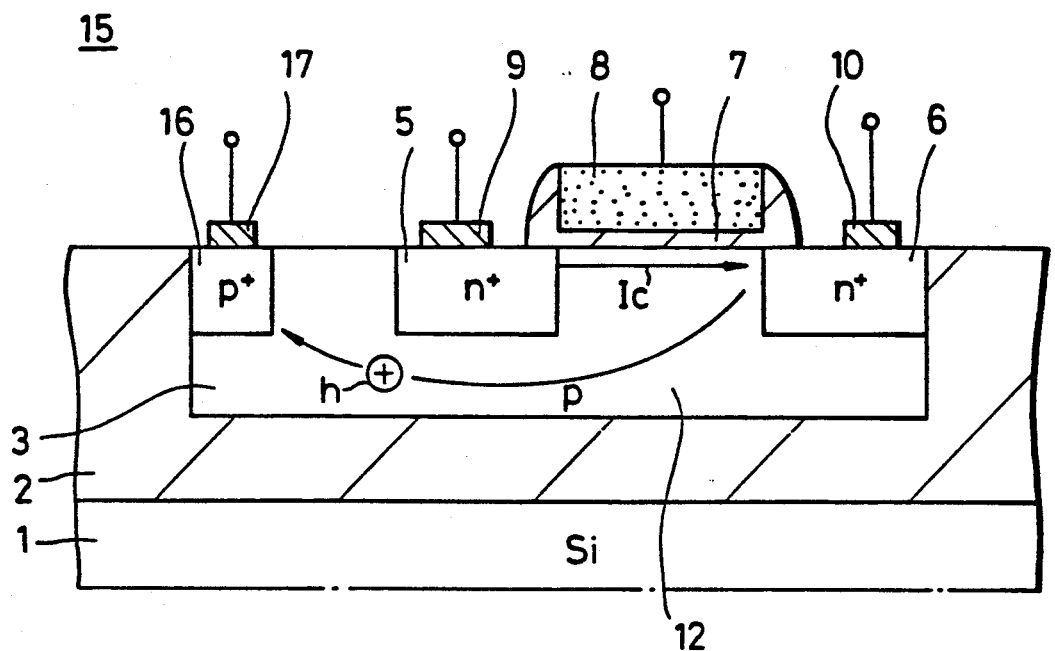
FIG. 3 is a schematic diagram showing a structure of a third example of the MIS semiconductor device according to the prior art.
Figure 4:
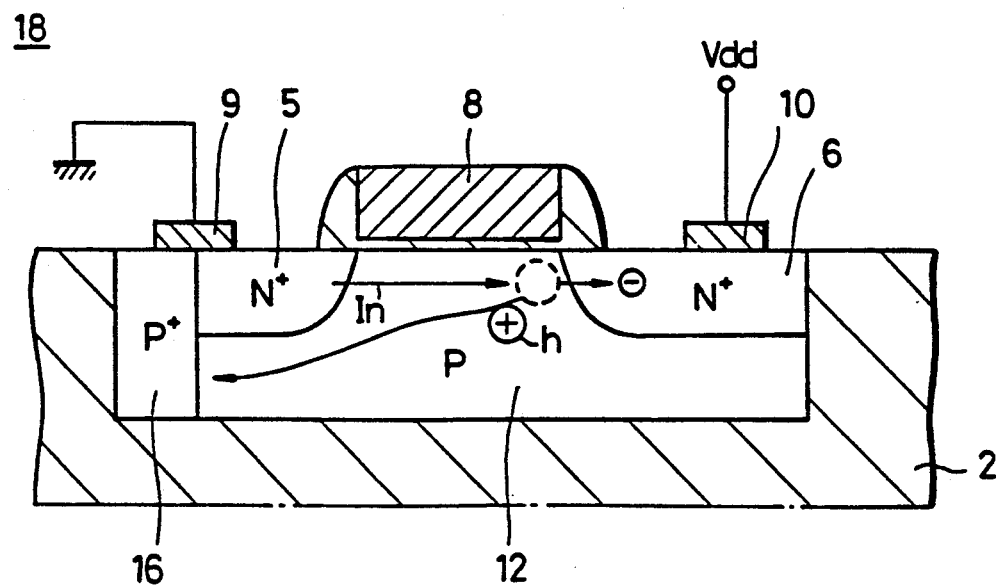
FIG. 4 is a schematic diagram showing a structure of a fourth example of the MIS semiconductor device according to the prior art.
Figure 5:
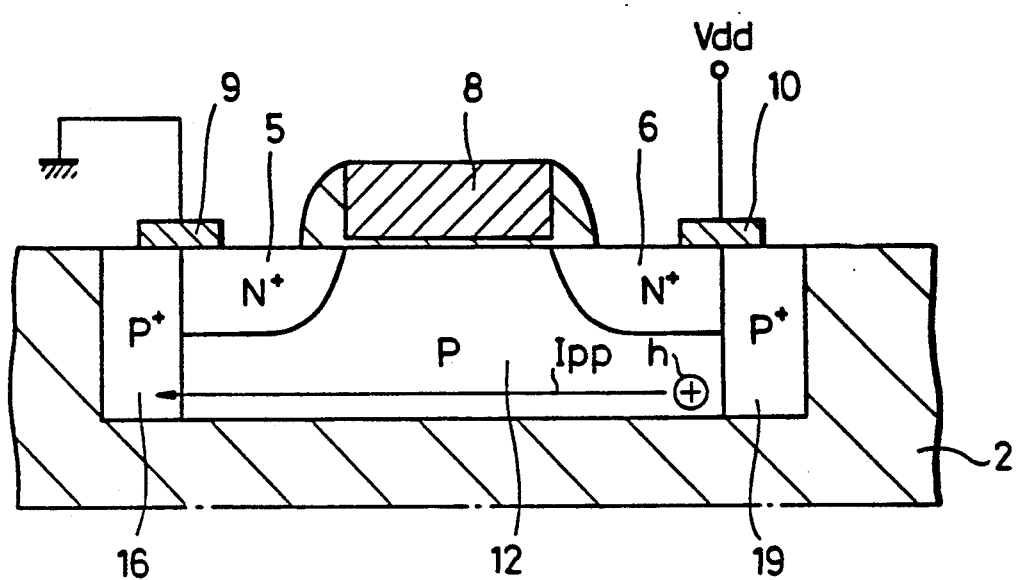
FIG. 5 is a schematic diagram showing a structure of a fifth example of the MIS semiconductor device according to the prior art.
Figure 10:
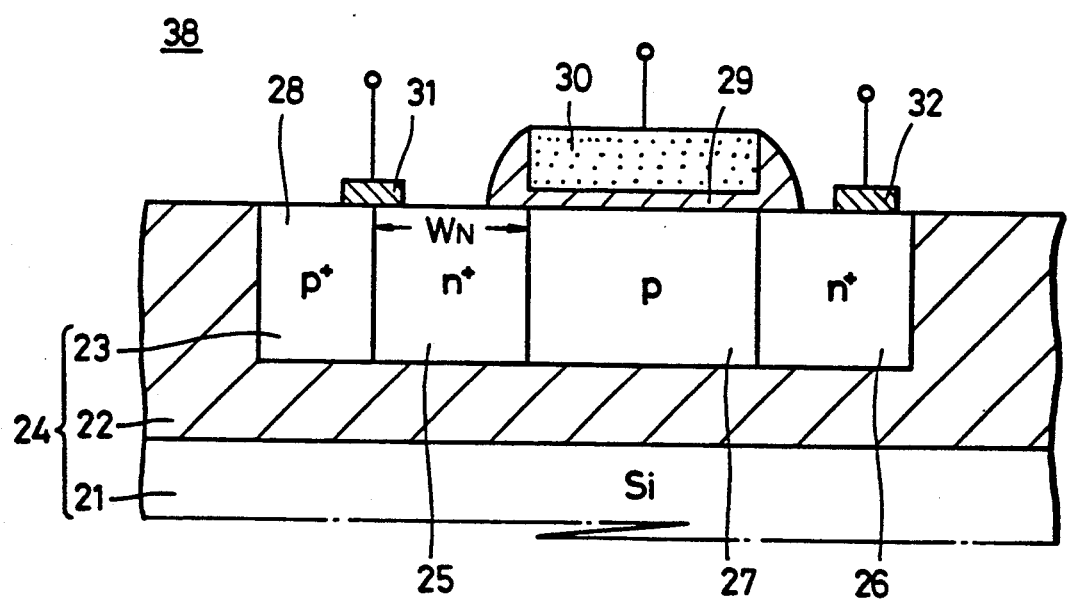
FIG. 10 is a schematic diagram showing a structure of a fifth embodiment of the MIS semiconductor device according to the present invention.
Figure 31:
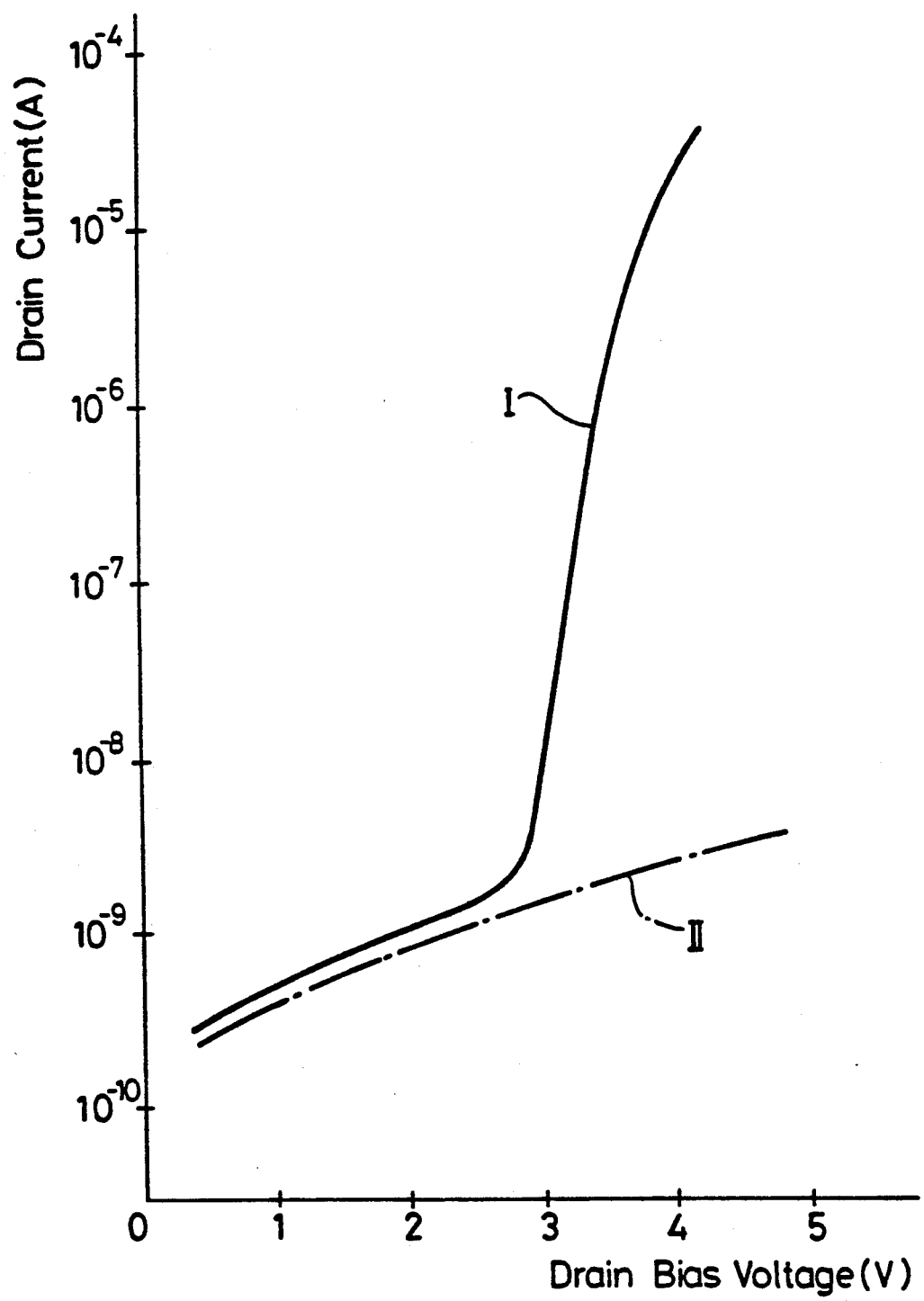
FIG. 31 is a graph showing the source-drain breakdown voltage characteristic of the MISFET according to the fifth embodiment of the present invention.

FIG. 10 shows a fifth embodiment of a three-terminal MISFET using the structure of FIG. 6, wherein a source electrode 31 is formed on both of the source region 25 and the p-type region 28 so as to commonly connect them with each other. FIG. 31 shows the simulation result of the characteristic of the source-drain breakdown voltage of the three-terminal MISFET 38 shown in FIG. 10. A curve II in FIG. 31 indicates the characteristic of the MISFET 38 of the fifth embodiment and a curve I in FIG. 31 the characteristic of the conventional MISFET shown in FIG. 1. Either of samples has a p-type channel region in an impurity concentration of $5 \times 10^{15}$ cm$^{-3}$, and n-type source region and drain region in an impurity concentration of $1 \times 10^{20}$ cm$^{-3}$. The impurity concentration of the p-type region 28 of the fifth embodiment is $1 \times 10^{18}$ cm$^{-3}$. It is also assumed that the silicon thin film has a thickness of 100 nm and the SiO$_2$ film (on the bottom) of the SOI substrate has a thickness of 1 $\mu$m, n$^+$ polycrystalline silicon is used for the gate electrode, and a gate voltage $V_g$ is selected to be $-0.5$ V.

From the results of this simulation, it is to be noted that the MISFET 38 of the fifth embodiment is improved in breakdown voltage between the source and the drain as compared with the conventional MISFET 11.

Figure 11:
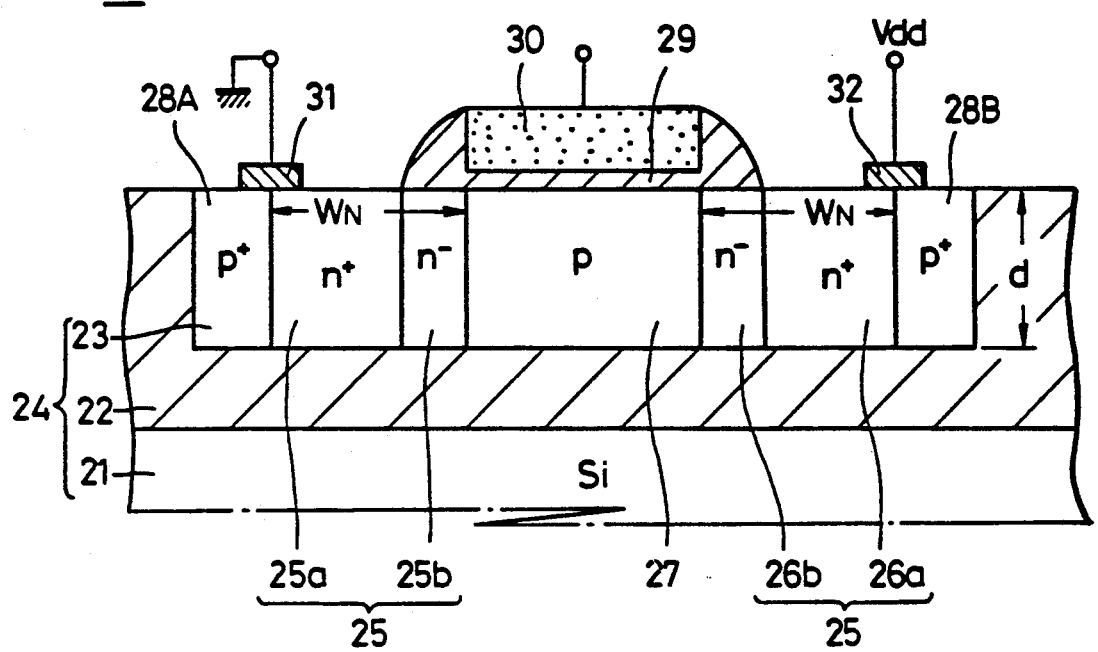
FIG. 11 is a schematic diagram showing a structure of a sixth embodiment of the MIS semiconductor device according to the present invention.

In the structures of the above-mentioned embodiments shown in FIGS. 6 to 10, it is possible to place the p-type region 28 symmetrically adjacent to both sides of the source region 25 and the drain region 26. FIG. 11 shows a sixth embodiment of the MISFET of a three-terminal LDD (lightly doped drain) structure. This MISFET 39 has p-type regions 28A and 28B respectively formed outside a source region 25 and a drain region 26 having high concentration regions 25a, 26a and low concentration regions 25b, 26b, wherein the source region 25 and the p-type region 28A are commonly connected by the source electrode 31, and the drain region 26 and the p-type region 28B are commonly connected by the drain electrode 32. Also in this structure, the effective distance (width) $W_N$ of the symmetric source region 25 and the drain region 26 is selected to be shorter than the diffusion length $L_p$ of the positive holes or the minority carrier in the source region 25 and the drain region 26. The drain electrode 32 and the source electrode 31 are respectively applied with a source voltage $V_{dd}$ and a ground voltage $V_{ss}$. The gate electrode 30 is made, for example, of boron-doped polycrystalline silicon, while the thickness d of the silicon thin film 23 is selected to be 80 nm, the impurity concentration of the channel region 27 approximately $10^{14}$ cm$^{-3}$, the impurity concentration of the low concentration regions 25b and 26b of the source region and the drain region approximately $10^{17}$ cm$^{-3}$, the impurity concentration of the high concentration regions 25a and 26a approximately $10^{20}$ cm$^{-3}$, and the impurity concentration of the p-type regions 28A and 28B about $10^{18}$ cm$^{-3}$.

According to the MISFETs of the respective embodiments described above, it is possible to suppress the degradation of the breakdown voltage between the source and the drain due to the impact ionization. Further, they can be used as ordinary three-terminal elements by commonly connecting the source region 25 and the newly provided p-type region 28 with an electrode metal or the like outside the device.

Since the p-type regions 28 can be symmetrically formed on both sides of the source region 25 and the drain region 26, the device can be used as a switching element such as an access transistor for a static RAM cell, thereby making it possible to extend an applicable range in circuit element.

Also, the structure is simple because the p-type regions 28 are merely formed outside the source region or outside the source region and the drain region, thereby providing a simple manufacturing-process.

In addition, the thus constructed devices will not damage the advantages of elements utilizing the SOI substrate such as a small prarasitic capacitance, a large freedom in setting the impurity concentration in the channel region 27, and a high durability against $\alpha$ rays and latch-up.

Figure 12:
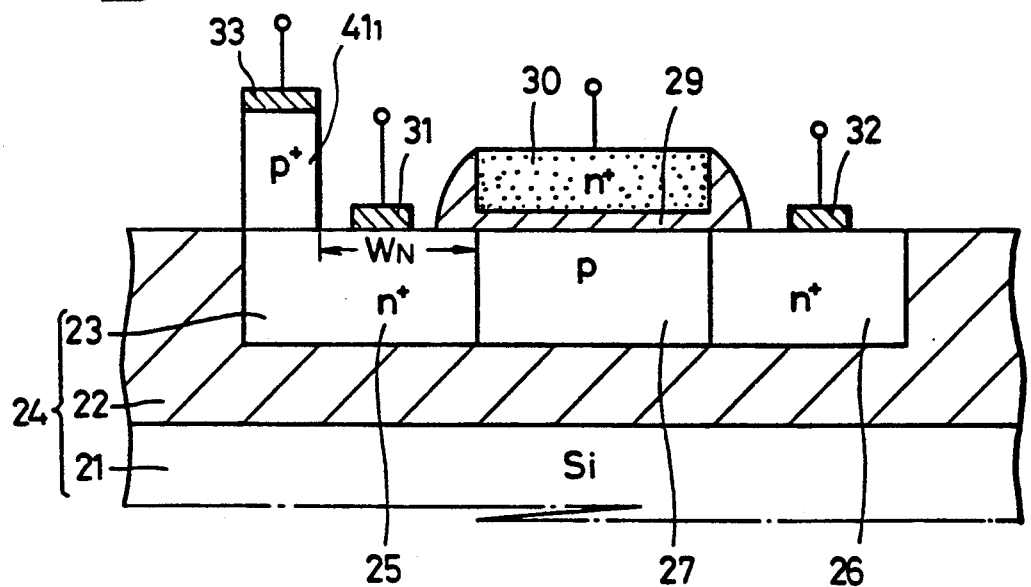
FIG. 12 is a schematic diagram showing a structure of a seventh embodiment of the MIS semiconductor device according to the present invention.
Figure 13:
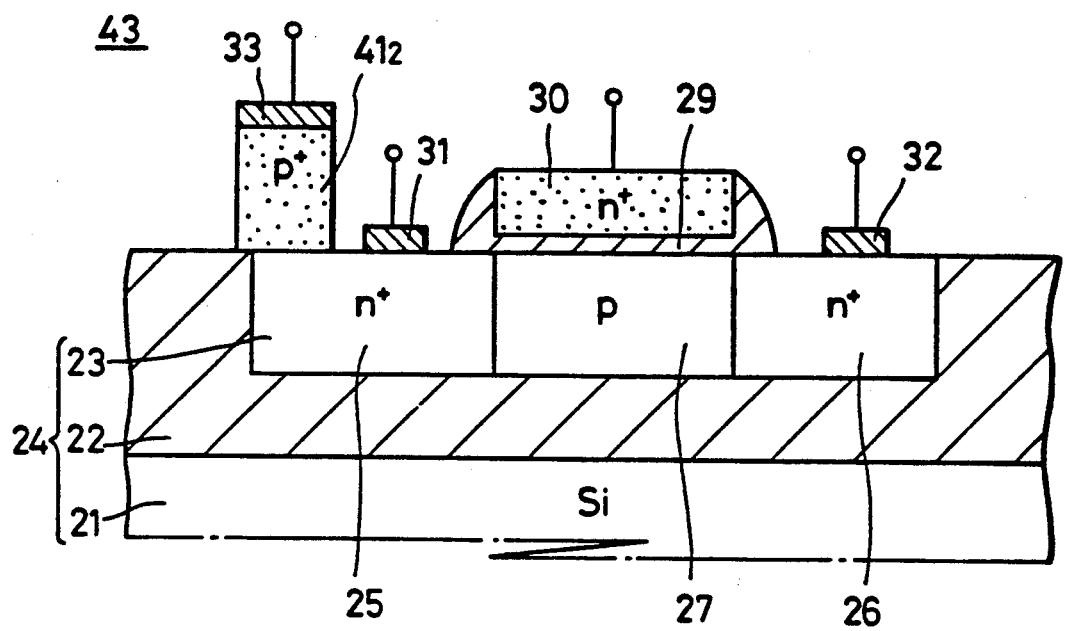
FIG. 13 is a schematic diagram showing a structure of an eighth embodiment of the MIS semiconductor device according to the present invention.
Figure 14:
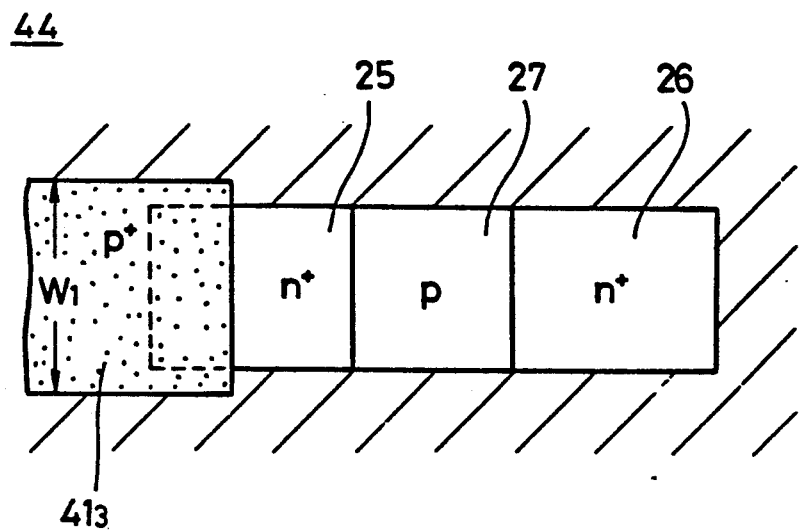
FIG. 14 is a schematic diagram showing a structure of a ninth embodiment of the MIS semiconductor device according to the present invention.
Figure 15:
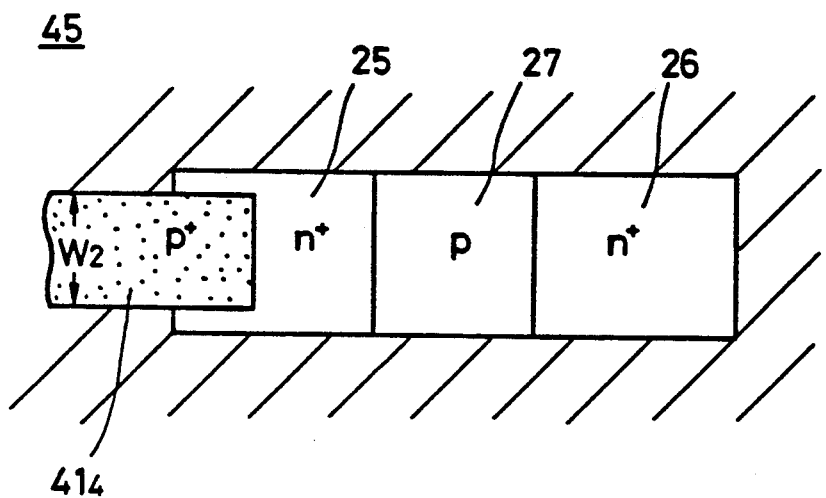
FIG. 15 is a schematic diagram showing a structure of a tenth embodiment of the MIS semiconductor device according to the present invention.

The aforementioned MISFET 34 shown in FIG. 6 has the p-type region 28 formed within the silicon thin film 23. Alternatively, it is possible to form p-type regions 41 (41$_1$, 41$_2$, 41$_3$ and 41$_4$) on the source region 25 adjacent to this source region 25 but separated from the p-type channel region 27, as shown in FIGS. 12 to 15. The rest of the structure thereof is similar to that of FIG. 6 so that like parts corresponding to those of FIGS. 12 to 15 are marked with the same references and therefore need not be described in detail. The distance $W_N$ of the source region 25 between the p-type region 41 and the channel region 27 is selected to be shorter than the diffusion length $L_p$ of the positive holes of the minority carrier. FIG. 12 shows a seventh embodiment of the present invention, in which the p-type region 41$_1$ is made of monocrystalline silicon and FIG. 13 shows an eighth embodiment of the present invention, in which the p-type region 41$_2$ is made of polycrystalline silicon. Also, FIGS. 14 and 15 show ninth and tenth embodiments of the present invention, in which the p-type regions 41$_3$ and 41$_4$ (which have different width $w_1$ and $w_2$) are formed of polycrystalline silicon, and these p-type regions 41$_3$ and 41$_4$ are utilized as wires, thus allowing the device to be used in a three-terminal structure.

In the thus constructed MISFETs 42 through 45, the pnp bipolar structure is also formed by the p-type region 27, the n-type source region 25 and the p-type region 41 (41$_1$, 41$_2$, 41$_3$ and 41$_4$) so that a hole current $I_o$ generated by the impact ionization through the p-type region 41 can be released to the lead-out electrode 33 to thereby improve the breakdown voltage between the source and the drain.

Figure 32:
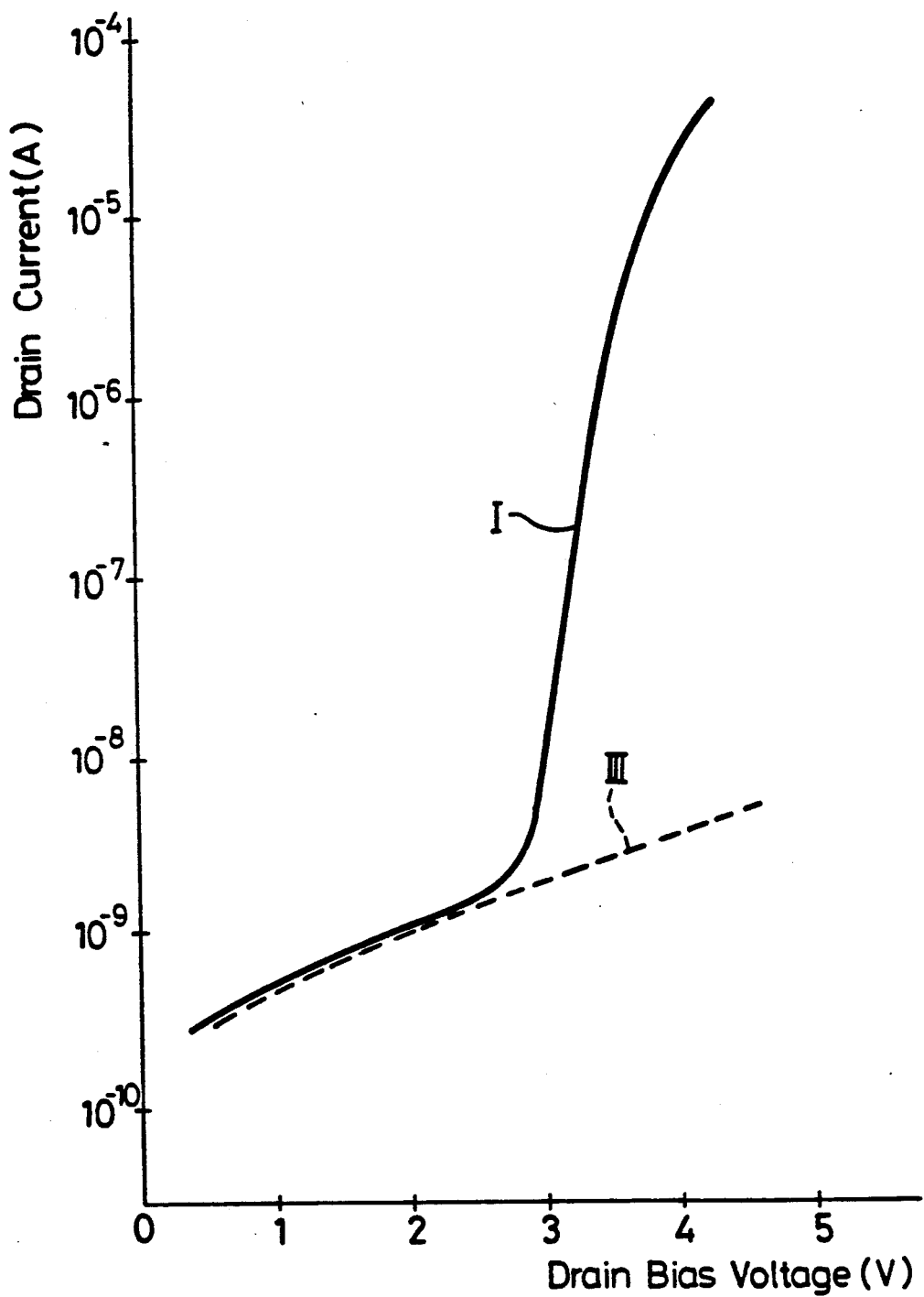
FIG. 32 is a graph showing the source-drain breakdown voltage characteristic of the MISFET according to the seventh embodiment of the present invention.

FIG. 32 illustrates the results of simulation of the source-drain breakdown voltage characteristics of the MISFET 42 of the seventh embodiment of the present invention. A curve III in FIG. 32 indicates the characteristic of the MISFET 42 according to the seventh embodiment, and a curve I indicates the characteristic of the conventional MISFET 11 of FIG. 1. Test samples employed in the seventh embodiment are the same as those of FIG. 31 excepting that the impurity concentration of the p-type region 41 of the seventh embodiment is selected to be $1\times10^{18}$ cm$^{-3}$. The results of simulation of FIG. 32 demonstrate that the breakdown voltage between the source and the drain of the MISFET 42 in the seventh embodiment is improved as compared with that of the conventional MISFET 11 of FIG. 1.

The MISFETs 42 through 45 of FIGS. 12 to 15 also may be used as the ordinary three-terminal elements by externally connecting the source region 25 and the p-type region 41 in common by means of an electrode metal or the like. Further, the p-type region 41 can be symmetrically formed on both sides of the source region 25 and the drain region 26. Furthermore, similarly as described above, the thus constructed semiconductor devices have advantages such as simple manufacturing-process, small parasitic capacitance, large freedom in setting the impurity concentration of channel region, a high durability against α rays and latch-up.

Figure 16:
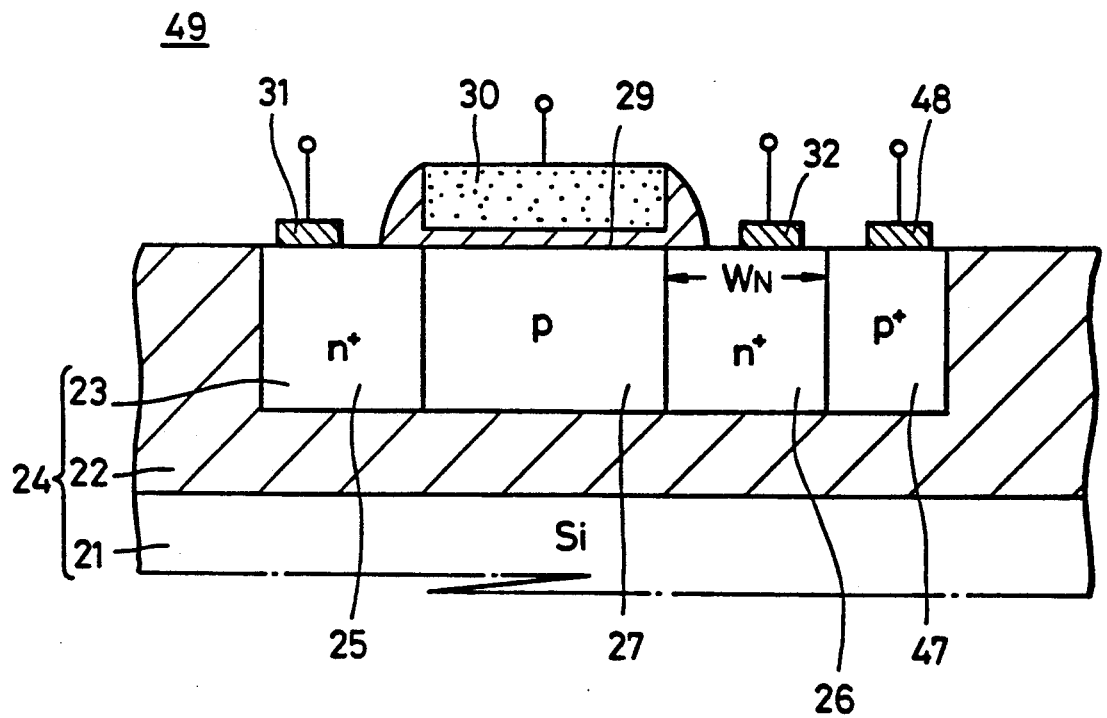
FIG. 16 is a schematic diagram showing a structure of an eleventh embodiment of the MIS semiconductor device according to the present invention.
Figure 34A:
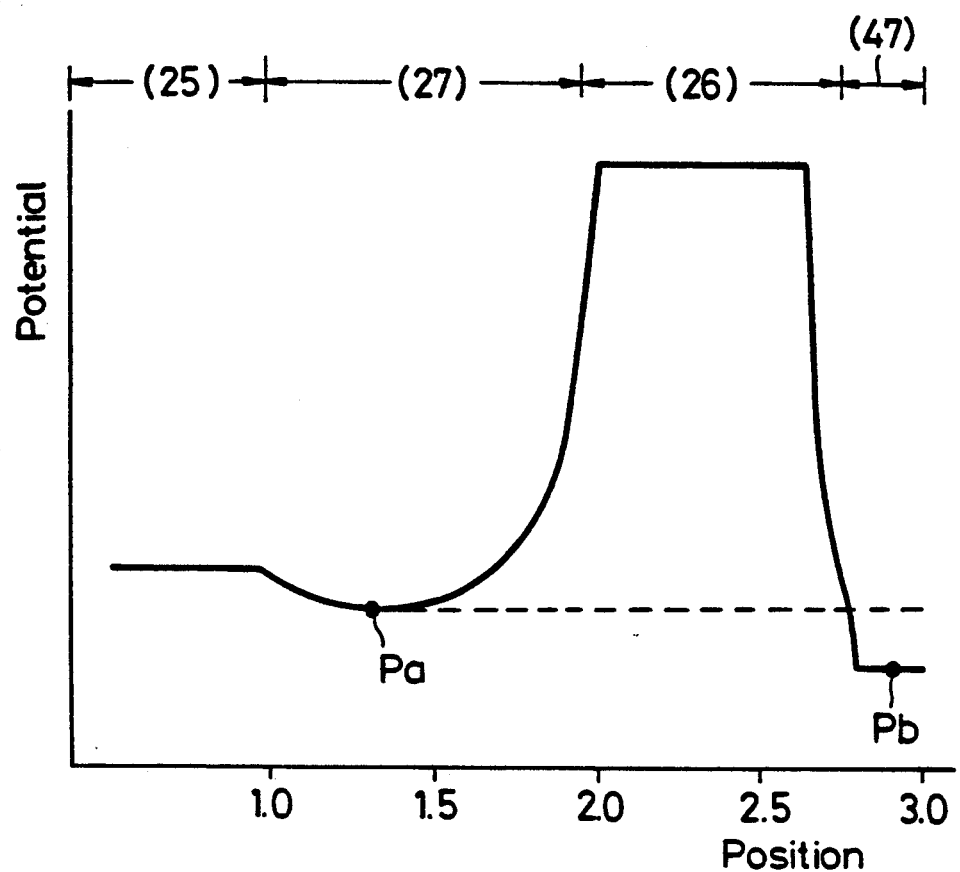
FIGS. 34A and 34B are a diagram of potential used to explain the eleventh embodiment of the MIS semiconductor device according to the present invention.
Figure 34B:
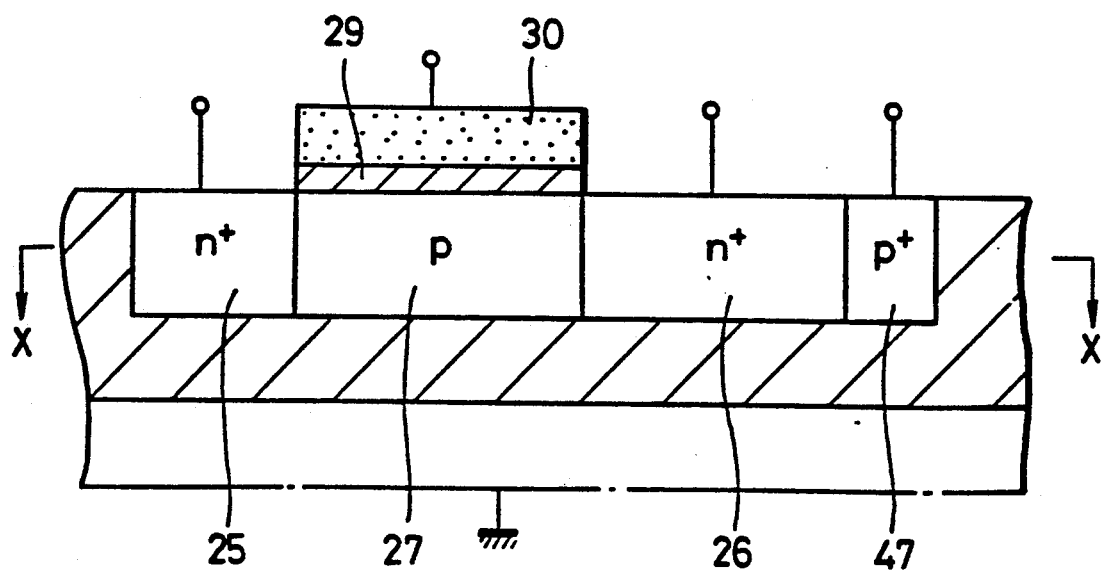

In the eleventh embodiment of the present invention shown in FIG. 16, in a silicon thin film 23 of, for example, p-type formed on an SOI substrate 24, there are formed the n-type source region 25 and the drain region 26 and, a p-type region 47 is formed adjacent to the drain region 26 and outside the drain region 26 so as to be separated from a channel region 27. The distance (width) $W_N$ of the drain region 26 between the p-type region 47 and the channel region 27 is selected to be shorter than the diffusion length $L_p$ of the positive holes of minority carrier. A polycrystalline silicon gate electrode 30 is formed on the channel region 27 between the source region 25 and the drain region 26 via a gate insulating film 29 made of, for example, SiO$_2$ or the like. Also, a source electrode 31, a drain electrode 32 and a lead-out electrode 48 are formed on the source region 25, the drain region 26 and the p-type region 47, respectively, to constitute a MISFET 49. The potential of the p-type region 47 may not coincide with the drain potential but must coincide with the source potential or must become substantially equal to the source potential. That is, as shown on a potential diagram of FIG. 34A (i.e., potential diagram along line X—X on the structure of FIG. 34B), a potential $p_b$ of the p-type region 47 must be selected to be lower than a potential $p_a$ of the channel region 27.

Figure 33:
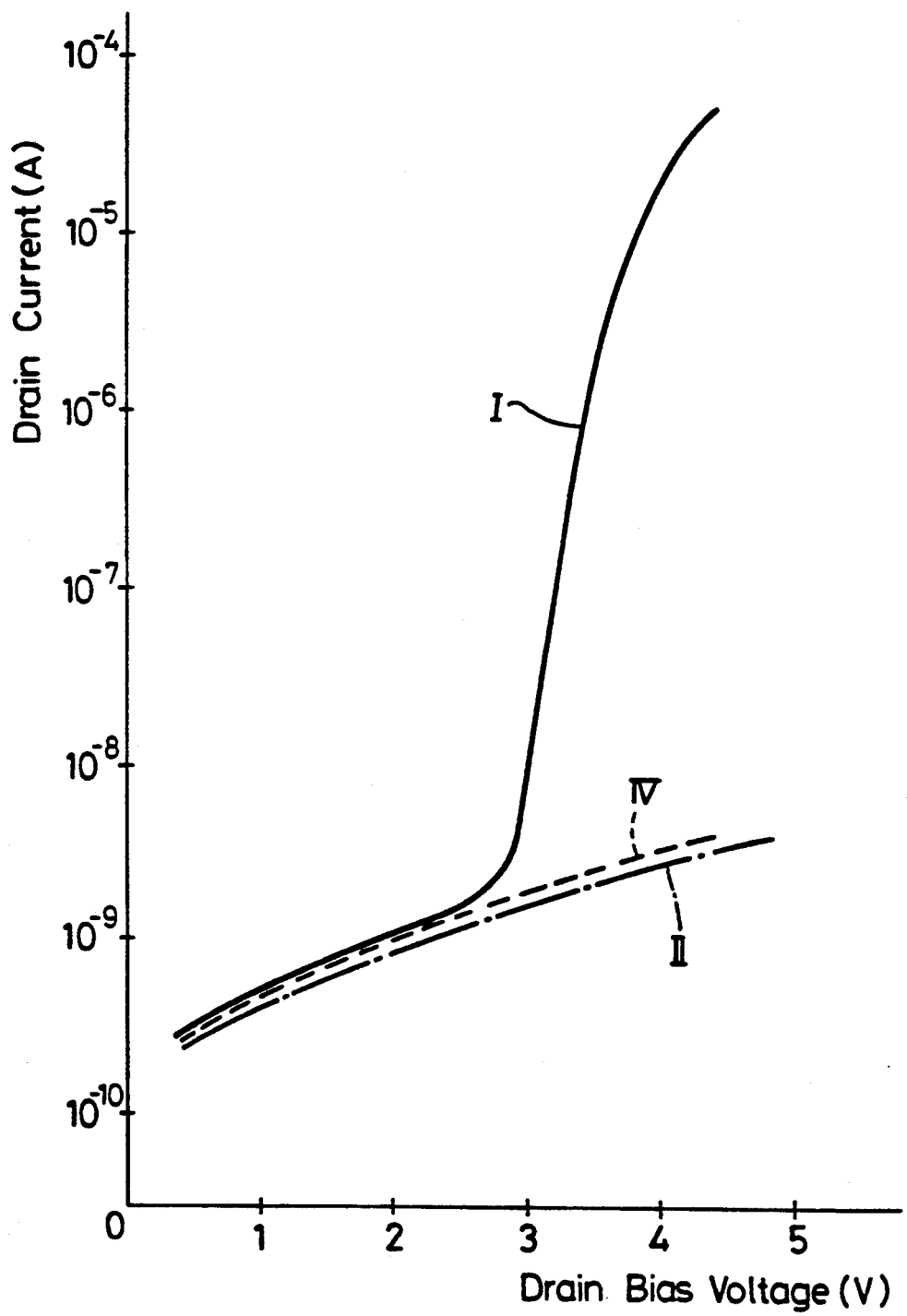
FIG. 33 is a graph showing the source-drain breakdown voltage characteristic of the MISFET according to the eleventh embodiment of the present invention.

In the thus constructed MISFET 49, the p-type region 47 is formed on the side of the drain region 26 close to the source of electron-hole pairs generated by the impact ionization, whereby the positive holes h generated by the impact ionization can be released from the drain region 26 through the p-type region 47, which leads to the improvement of the breakdown voltage between the source and the drain. FIG. 33 shows results of simulation of the source-drain breakdown voltage characteristics of the MISFET 49 of the eleventh embodiment of the invention. In FIG. 33, a curve IV indicates the characteristic of the MISFET 49 of the eleventh embodiment, a curve I indicates the characteristic of the conventional MISFET 11 of FIG. 1 and a curve II indicates the characteristic of the MISFET 34 of FIG. 6. Test samples employed in the eleventh embodiment are the same as those of FIG. 31 excepting that the impurity concentration of the p-type region 47 is selected to be $1\times10^{18}$ cm$^{-3}$ and that the potential of the p-type region 47 is selected to be 0 V which is same as the potential of the source region. The results of simulation demonstrate that the source-drain breakdown voltage of the MISFET 49 of the eleventh embodiment is improved as compared with that of the conventional MISFET 11 of FIG. 1.

The structure of the MISFET 49 can achieve similar effects as those of the MISFET 34 of FIG. 6 excepting for that it cannot be formed as the three-terminal structure.

Figure 17:
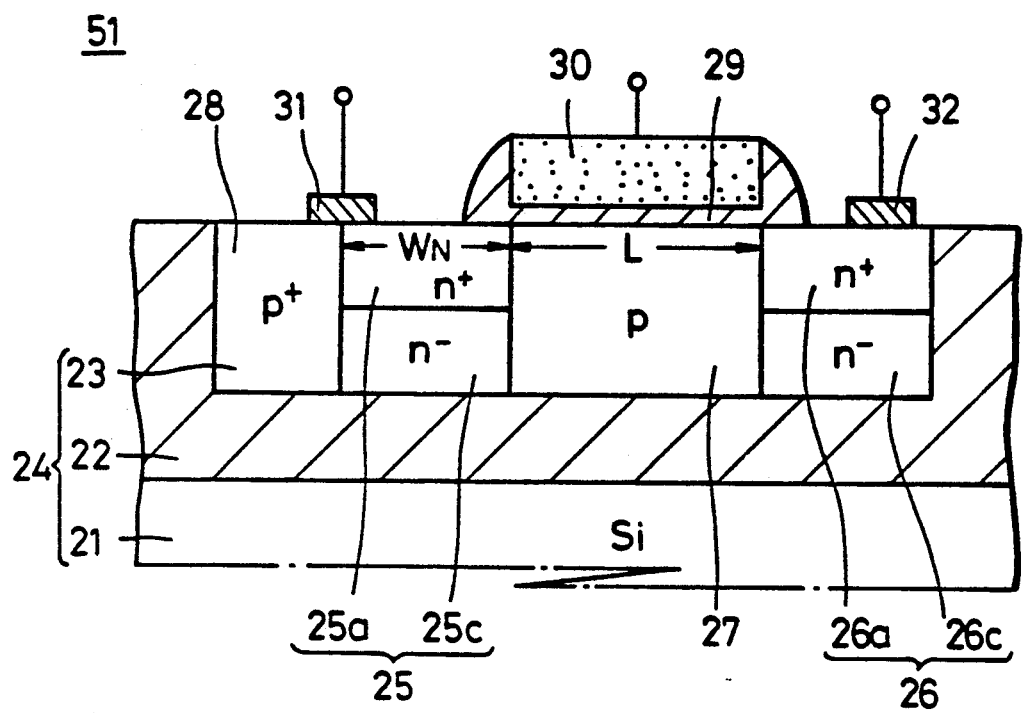
FIG. 17 is a schematic diagram showing a structure of a twelfth embodiment of the MIS semiconductor device according to the present invention.

FIG. 17 shows the twelfth embodiment of the present invention. In the twelfth embodiment, in a silicon thin film 23, for example, of p-type, comprised in an SOI substrate 24, there are formed an n-type source region 25 and a drain region 26 respectively having high concentration regions 25a and 26a and low concentration regions 25c and 26c, formed beneath the high concentration regions 25a and 26a, reaching an SiO$_2$ film 22 on the bottom, respectively, and a p-type region 28 is formed adjacent to the high concentration region 25a and the low concentration region 25c of the source region 25 so as to be separated from a channel region 27. On the channel region 27 between the source region 25 and the drain region 26, there is formed a gate electrode 30 made, for example, of polycrystalline silicon through a gate insulating film 29 made of SiO$_2$ or the like, a source electrode 31 commonly connected, for example, to the p-type region 28 and the high concentration region 25a of the source region 25 is formed, and a drain electrode 32 is also formed on the high concentration region 26a of the drain region 26 to constitute a MISFET 51. The high concentration regions 25a and 26a are provided to reduce the source resistance and the drain resistance, respectively, while the low concentration region 25c is provided to allow a hole current generated by the impact ionization, which will be described later, to readily flow to the p-type region 28. The width $W_N$ of the low concentration region 25c is selected to be shorter than the diffusion length $L_p$ of the positive holes of minority carrier.

The above-mentioned structure can be operated as a pnp bipolar transistor in which the p-type channel region 27, the low concentration region 25c of the n-type source region 25 and the p-type region 28 are respectively functioned as emitter, base and collector, whereby the holes h (hole current $I_p$) of the minority carrier generated by the impact ionization is released from the channel region 27 through the p-type region 28 to the source electrode 31 to suppress the degradation of the breakdown voltage between the source and the drain due to the impact ionization similarly to FIG. 6. Moreover, this embodiment provides the low concentration region 25c which further facilitates the flow of the positive holes as compared with FIG. 6, thereby making it possible to further improve the source-drain breakdown voltage.

Assuming that a channel current of the MISFET using the SOI substrate is $I_o$, a hole current generated in a high electric field is $I_p$ and an electron current provided when a channel potential becomes higher than a source potential to allow the bipolar operation is $I_n$, then a drain current ID is given by:

$$I_D = I_o + I_n + I_p \quad (1)$$

Further, assuming that a ratio in which the hole current $I_p$ is generated by the channel current $I_o$ and the electron current $I_n$ is $K(V_D)$, then we have:

$$I_p = K(V_D)(I_o + I_n) \quad (2)$$

Further, $I_p$ and $I_n$ may be transformed as follows:

$$I_p = S(qD_p n_i^2/N_D W_N)(e^{\frac{qU}{kT}} - 1) \quad (3)$$

$$I_n = S(qD_n n_i^2/N_A \cdot L)(e^{\frac{qU}{kT}} - 1) \quad (4)$$

where $D_p$ is the diffusion coefficient of the hole, S is the junction dimension, n is the intrinsic carrier concentration, $N_D$ is the donor concentration in the low concentration region 25c of the source, $W_N$ is the width of the low concentration region 25c of the source, $N_A$ is the acceptor concentration in the channel region 27, L is the length of the channel region 27 and V is the potential difference between the source and the channel.

The above equations (1) to (4) yield:

$$I_D = \frac{(1 + K(V_D))I_o}{\left(1 - \frac{D_n W_N N_D}{D_p L N_A} K(V_D)\right)}$$

Accordingly, the more the concentration $N_D$ and the width $W_N$ of the low concentration region 25c of the source region 25 are reduced, the smaller the drain current $I_D$ becomes, thus increasing the drain breakdown voltage.

In the structure shown in FIG. 17, since the silicon thin film 23 is isolated from the substrate 21 by the $SiO_2$ film 22, no substrate effect is achieved, whereby the current driving capability of the MISFET 51 can be increased. The minority carrier generated by α rays can be released to the source region side, which can provide a higher durability against α rays. This embodiment can provide advantages similar to those of FIG. 6 such that the source and the drain can be symmetrically formed, the manufacturing-process is simple, the parasitic capacitance is small, the freedom in setting the impurity concentration of channel is large and the durability against α rays and latch-up is high and that the advantage of the SOI substrate is not damaged.

Figure 18:
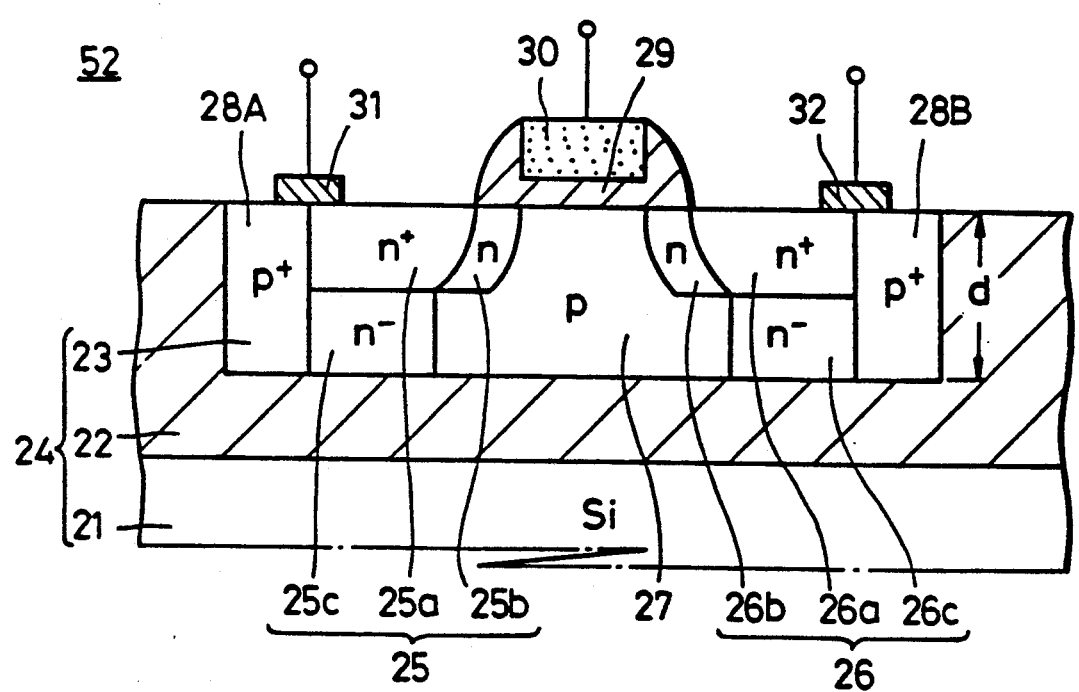
FIG. 18 is a schematic diagram showing a structure of a thirteenth embodiment of the MIS semiconductor device according to the present invention.

FIG. 18 shows the thirteenth embodiment of the present invention in which the source region side and the drain region side are formed symmetrically. The structure of this embodiment is provided by forming an n-type source region 25 and a drain region 26 having high concentration regions 25a, 26a and low concentration regions 25b, 26b of LDD, respectively, in a p-type silicon thin film 23 and other low concentration regions 25c, 26c beneath the high concentration regions 25a, 26a, respectively, adjacent to a channel region 27. Further, p-type regions 28A, 28B are formed such that they are respectively adjacent to the low concentration regions 25c, 26c and the high concentration regions 25a, 26a so as to be separated from the channel region 27. Then, the source region 25 and the p-type region 28A are commonly connected by a source electrode 31, while the drain region 26 and the p-type region 28B are commonly connected by a drain electrode 32. A gate electrode 30 is made of, for example, phosphor-doped polycrystalline silicon. The thickness d of the silicon thin film 23 is selected to be about 150 nm, the impurity concentration of the p-channel region 27 is selected to be about $10^{17}$ cm$^{-3}$, the impurity concentration of the high concentration regions 25a and 26a of the source region and the drain region are selected to be approximately $10^{20}$ cm$^{-3}$, the impurity concentration of the low concentration regions 25b and 26b of LDD are selected to be approximately $10^{18}$ cm$^{-3}$, and the impurity concentration of the low concentration regions 25c and 26c are selected to be approximately $10^{15}$ cm$^{-3}$ to $10^{16}$ cm$^{-3}$.

Since the source and drain can be symmetrically formed as described above, the MISFET of the thirteenth embodiment can be used as a switching element such as an access transistor for a static RAM cell.

While the semiconductor device of FIG. 17 is formed as the three-terminal structure, it can be formed as the four-terminal structure similarly to FIG. 6.

Figure 30:
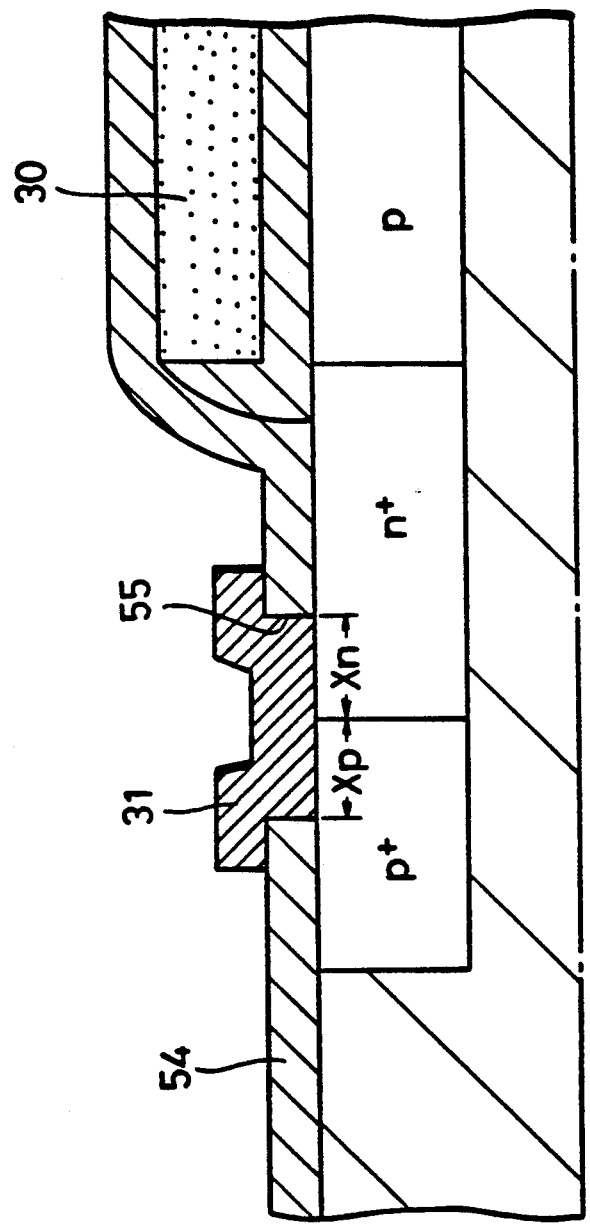
FIG. 30 is a cross-sectional view used to explain the twenty-fourth embodiment of the MIS-type semiconductor device according to the present invention.

When the aforementioned MISFET is employed as the three-terminal element by commonly connecting the source region 25 and the p-type region 28, as shown in FIG. 30, a window aperture 55 is bored through an $SiO_2$ film 54 so as to be positioned on both of the source region 25 and the p-type region 28, and a common metal electrode, for example, an Al electrode 31 is connected to the respective regions 25 and 28 is formed in this window aperture 55. A minimum dimension l of the window aperture 55 is given by:

$$l = Xp_{min} + Xn_{min} + 2A$$

where $Xp_{min}$ and $Xn_{min}$ are the minimum dimensions necessary for the contact with the p-type region 28 and the n-type source region 25, respectively and which are determined by a contact tolerance and accuracy in the window dimension (accuracy of photolithography and etching-process). A in the above equation designates an overlap accuracy of photoresist which concerns two photoresist processes for determining p+-n+ junction and for determining the position of the window aperture 55 through the $SiO_2$ film 54. If $Xp_{min}$, $Xn_{min}$ and A are all selected to be 0.2 μm, then the minimum dimension of the contact window aperture 55 is 0.8 μm, which may bring about the risk that the semiconductor device of this embodiment can not be sufficiently applied to the highly-integrated devices.

Figure 19:
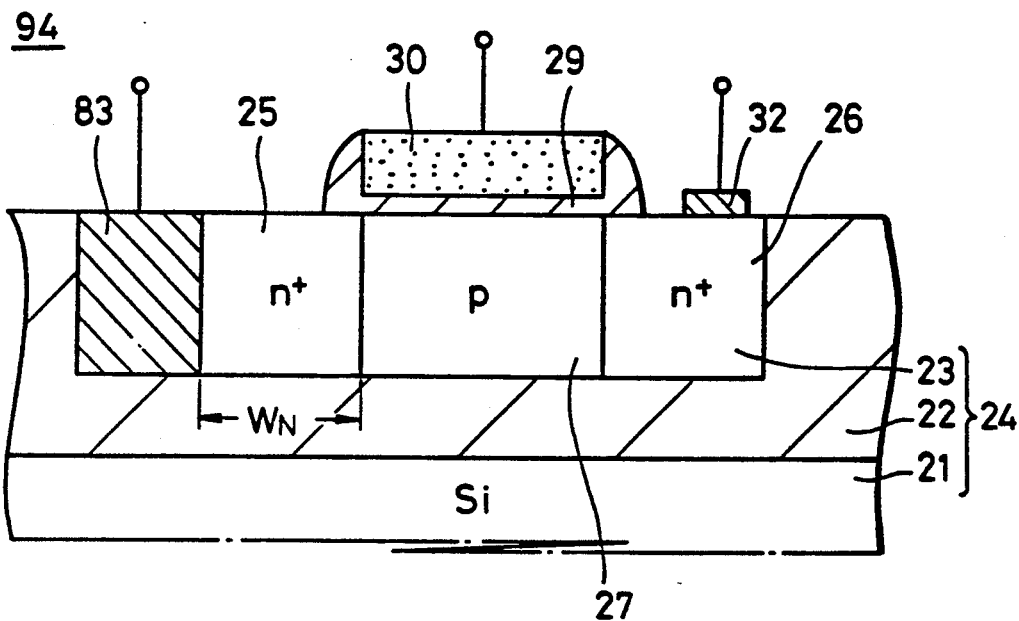
FIG. 19 is a schematic diagram showing a structure of a fourteenth embodiment of the MIS semiconductor device according to the present invention.

FIG. 19 shows the fourteenth embodiment of the present invention which can improved the aforementioned shortcomings. In this embodiment, the MISFET is applied to the semiconductor structure shown in FIG. 6 but it is needless to say that this structure can be applied to the foregoing embodiments.

Figure 29A:
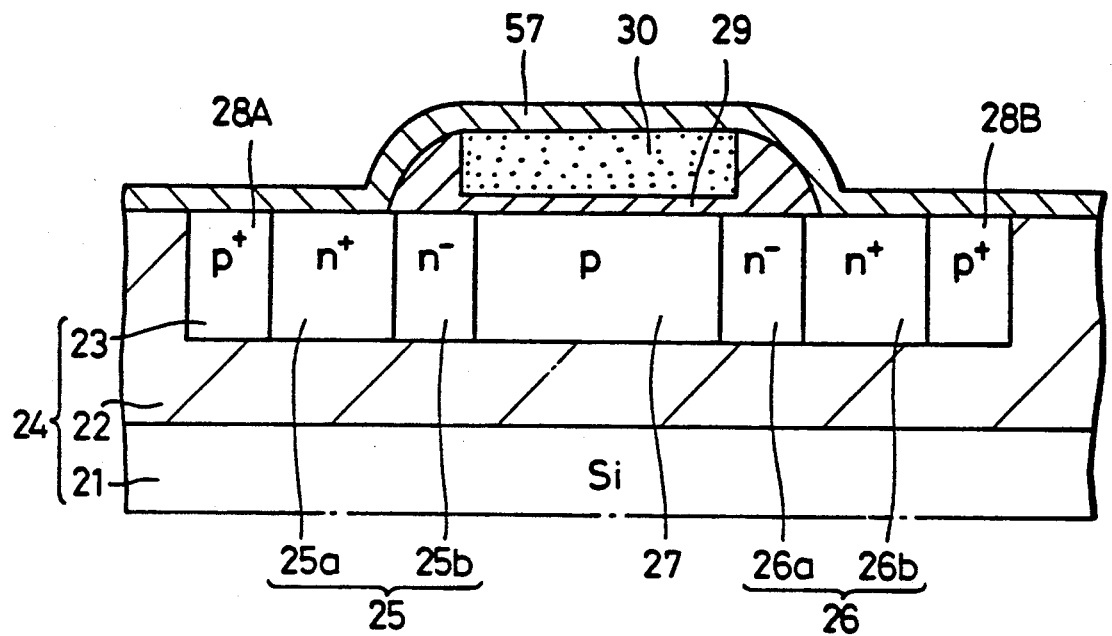
FIGS. 29A to 29D are schematic diagrams, respectively, to which references will be made in explaining a manufacturing-process of the twenty-fourth embodiment of the MIS-type semiconductor device according to the present invention.

Referring to FIG. 29A, initially, in the silicon thin film 23 formed in the SOI substrate 24, there are formed LDD-structured n-type source region 25 and the drain region 26, symmetrical p-type regions 28A and 28B outside the source region and the drain region, and a gate electrode 30 made of polycrystalline silicon through a gate insulating film 29, and then a refractory metal, for example, Ti film 57 is deposited over the whole surface.

Figure 29B:
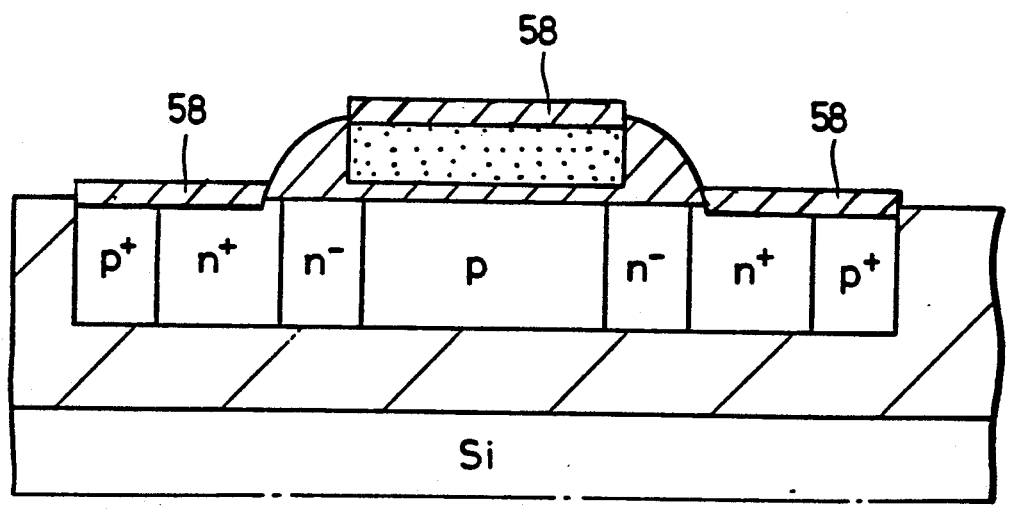
Figure 29C:
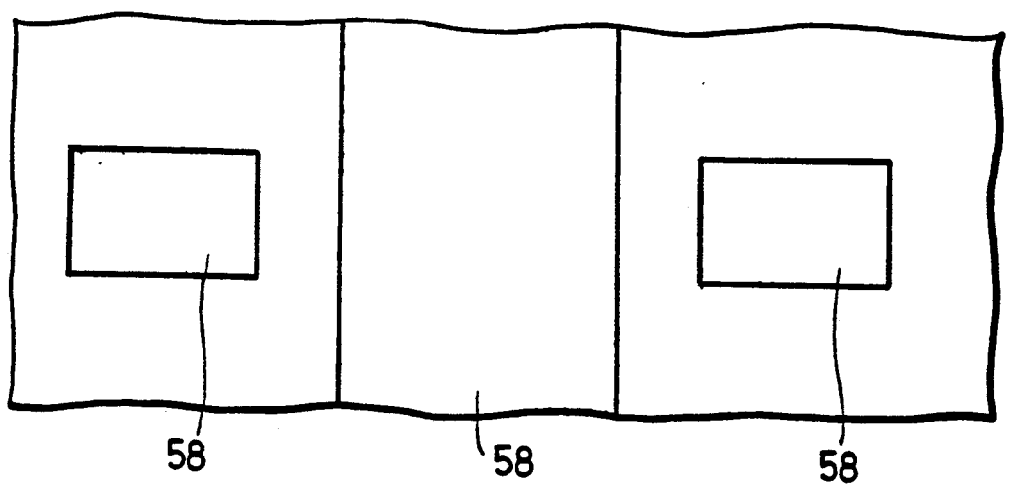

In the next process, as shown in FIGS. 29B and 29C, the film is annealed to be silicided. Then, the remaining Ti film 57 except for a Ti silicide film 58 is removed. The silicide film 58 is formed on an area covering the source region 25 and the p-type region 28A, on an area covering the drain region 26 and the p-type region 28B and on the surface of the gate electrode 30.

Figure 29D:
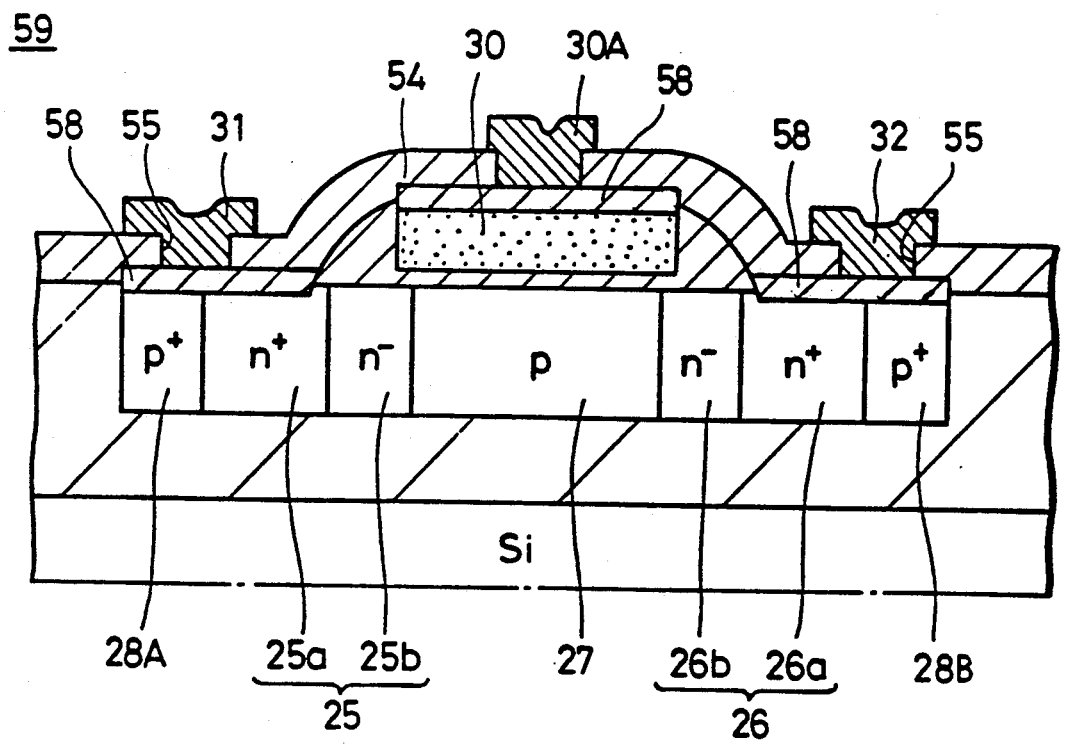

Thereafter, as shown in FIG. 29D, an $SiO_2$ film 54 is formed over the entire surface of the device, contact windows 55 are respectively formed through a photoresist, and then a source electrode 31, a drain electrode 32 and a gate lead-out electrode 30A, all made of Al, are formed, for example, through a barrier metal, if necessary, to obtain a target MISFET 59.

According to the thus constructed MISFET 59, since the p-type region 28A and the source region 25, and the p-type region 28B and the drain region 26 are connected with each other by the Ti silicide film 58, a contact window of a minimum pattern, which is determined by the resolution of photoresist, is sufficient for providing the window aperture 55 for Al contact subsequently formed, whereby the minimum dimension of the contact window 55 is reduced as compared with the embodiment of FIG. 30. Therefore, the semiconductor device of this embodiment can be formed as the fine pattern elements and formed into the highly-integrated device.

Since the aforementioned structure of FIG. 6 can be formed of the silicon thin film 23 of relatively thin thickness, a short channel effect is difficult to occur. However, in the structure having the low concentration regions 25c and 26c as shown in FIG. 17, the thickness of the silicon thin film 23 is increased so that the short channel effect occurs (because the semiconductor device becomes difficult to control by the gate voltage). There is then the risk that a leak current will increase. Accordingly, the concentration of the channel region 27 must be increased in order to avoid the short channel effect.

When the gate electrode 30 is made of phosphor-doped polycrystalline silicon, the channel concentration, particularly, the concentration on the surface of the channel is increased in order to control a threshold voltage $V_{th}$. By way of example, as described above with reference to FIG. 18, the concentration of the channel region 27 is selected to be about $10^{17}$ cm$^{-3}$ which is higher than that of the low concentration regions 25c and 26c of the source region and the drain region (approximately in a range of from $10^{15}$ cm$^{-3}$ to $10^{16}$ cm$^{-3}$). It is difficult to manufacture, by the prior-art technique, the MISFET 52 shown in FIG.18 which has a concentration lower than the channel region 27. FIGS. 38A to 38D and FIGS. 41A to 41H show examples of manufacturing-process of the MISFET 52.

Figure 38A:
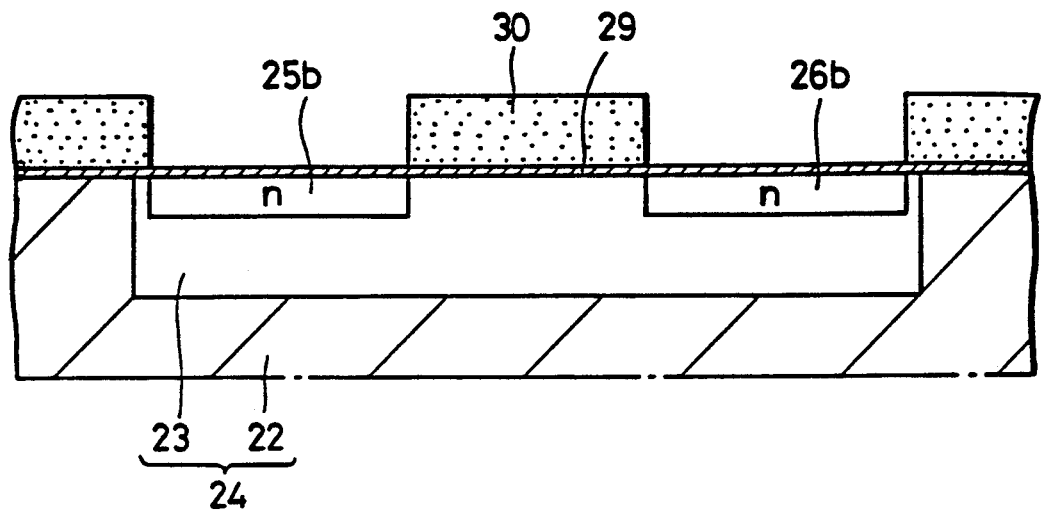
FIGS. 38A through 38D are cross-sectional views showing the manufacturing-process of the thirteenth embodiment of the present invention.

The example of FIGS. 38A to 38D will first be described. Referring to FIG. 38A, a gate electrode 30 made of phosphor-doped polycrystalline silicon is formed on a silicon thin film 23 through a gate insulating film 29, and LDD-structured n-type low concentration regions 25b and 26b are formed with the gate electrode 30 used as a mask.

Figure 38B:
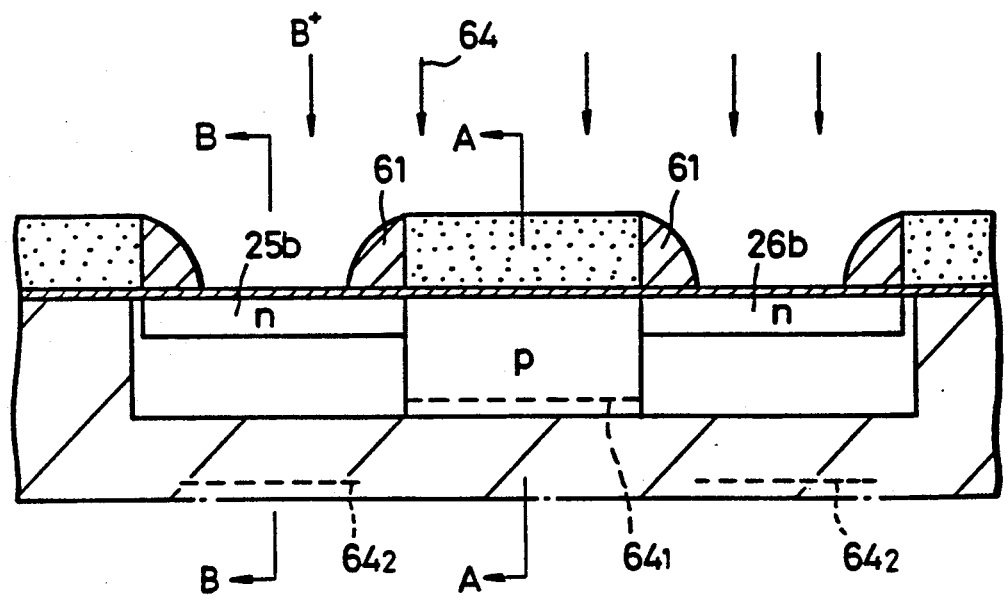

Next, side walls 61 made of SiO$_2$ are formed on sides of the gate electrode 30, as shown in FIG. 38B, and then a p-type impurity, for example, boron 64 is ion-implanted so as to provide the channel region with a concentration of approximately $10^{17}$ cm$^{-3}$ (for example, not less than $10^{17}$ cm$^{-3}$ on the bottom and approximately $5 \times 10^{16}$ cm$^{-3}$ on the surface). This ion implantation is intended to control the threshold voltage $V_{th}$ as well as prevent the short channel effect. This ion implantation is performed through the gate electrode 30 to form a concentration profile such that an ion implantation peak 64$_1$ exists in the vicinity of the bottom of the channel 27.

Figure 39A:
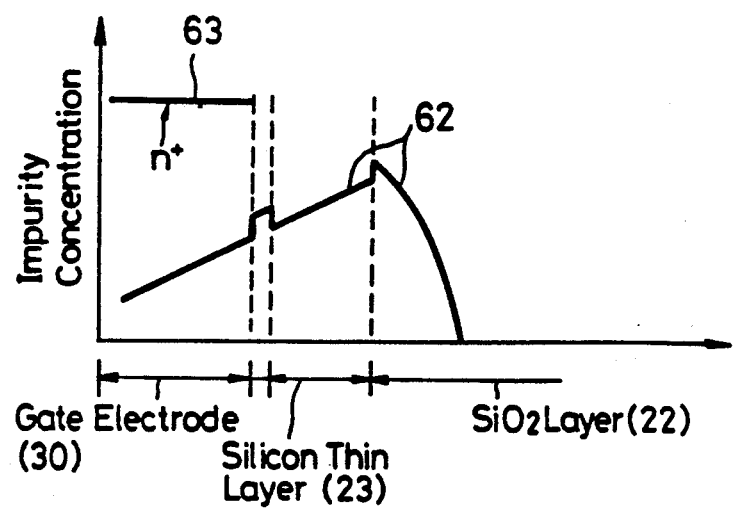
FIGS. 39A and 39B are diagrams showing impurity concentration profiles of main portions in the manufacturing-process, respectively.
Figure 39B:
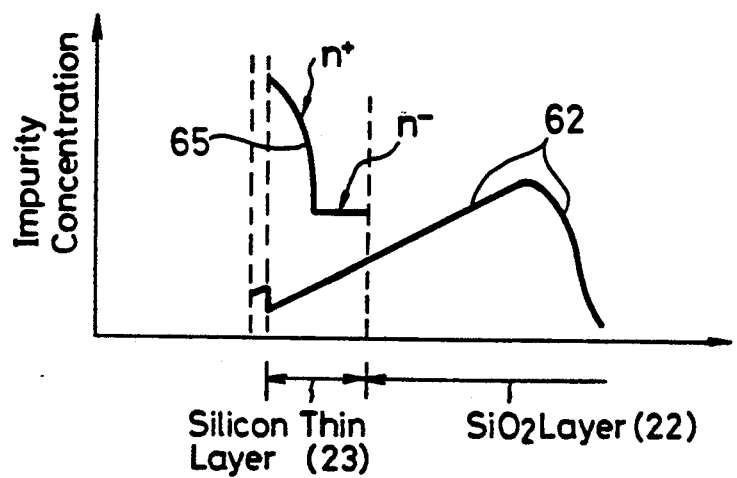

FIG. 39A shows a concentration profile on a line A—A passing the channel region 27 after the ion implantation and active anneal processing, wherein reference numeral 62 designates a concentration profile of boron, and 63 that of the gate electrode 30 made of n+ polycrystalline silicon. Thus, portions corresponding to the source region 25 and the drain region 26 are lower by the thickness of the gate electrode 30, whereby an ion implantation peak 62 exists in the SiO$_2$ film 22 positioned beneath the source and drain regions, so that the boron concentration is extremely low. More specifically, it is lower than the concentration in the n-type low concentration regions 25c, 26c formed in the later process. FIG. 39B shows a concentration profile on a line B—B passing the source region 25 (or the drain region 26), wherein reference numeral 62 designates a concentration profile of boron. Reference numeral 65 designates a concentration profile of the high concentration region 25a (or 26a) and the low concentration region 25c (or 26c) of the source region (or the drain region), later referred to.

Figure 38C:
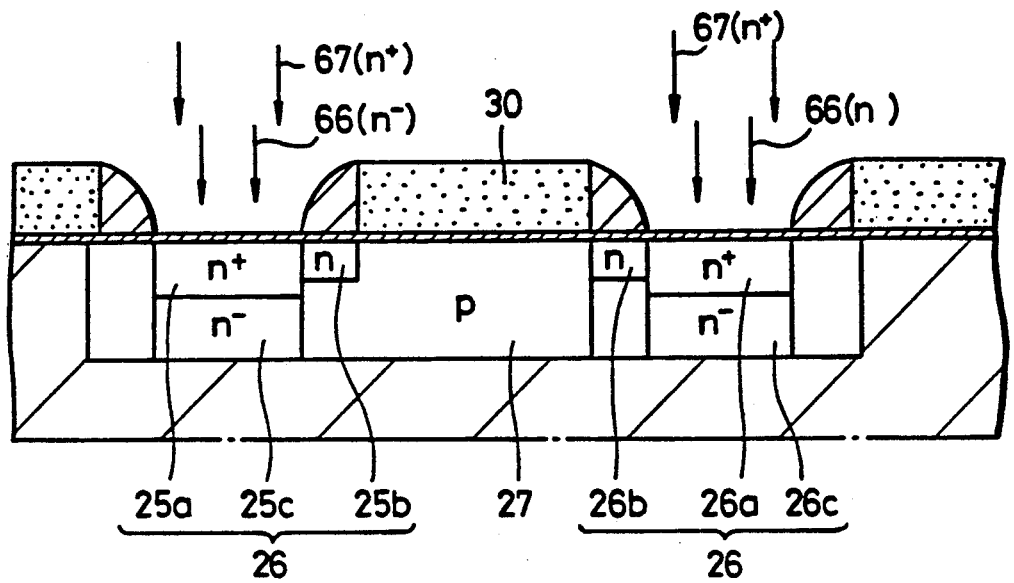

Subsequently, an n-type impurity 66 in a low concentration is ion-implanted to form the n-type low concentration regions 25c, 26c in a concentration of approximately $10^{15}$ cm$^{-3}$–$10^{16}$ cm$^{-3}$, and then n-type impurity 67 in a high concentration is ion-implanted to form the high concentration regions 25a, 26a in a concentration of approximately $10^{20}$ cm$^{-3}$ on the n-type low concentration regions 25c and 26c, as shown in FIG. 38C. Thus, the source region 25 is composed of the regions 25a, 25b and 25c while the drain region 26 of the regions 26a, 26b and 26c.

Figure 38D:
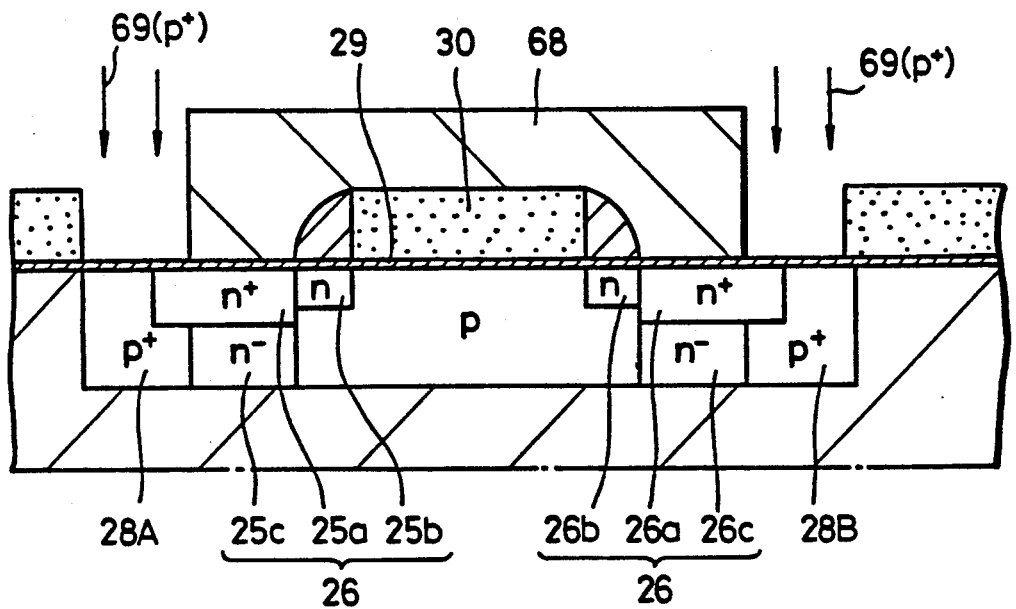

Next, as shown in FIG. 38D, side walls 61 are etched off utilizing a photoresist 68 and polycristalline silicon film 30 as masks. Subsequently p-type impurity, for example, boron 69 is implanted through a photoresist 68 and polycrystalline silicon 301 as masks to form the p-type regions 28A and 28B outside the source region 25 and the drain region 26 but separated from the channel region 27. Then, a source electrode and a drain electrode are formed to obtain the MISFET 52 shown in FIG. 18. According to this manufacturing method, the boron 64 is implanted by utilizing the thickness of the gate electrode 30 to raise only the concentration of the channel region 27, so that the n-type low concentration regions 25c, 26c, in a concentration lower than that of the channel region 27 can be formed by the later ion implantation of the impurity 66. It is therefore possible to readily manufacture the MISFET 52 shown in FIG. 18 capable of preventing the short channel effect in a high accuracy and in a self-align fashion. It is also possible to readily form this type of MISFET having a phosphor-doped polycrystalline silicon which must have a channel region in a high concentration because the control of the threshold voltage $V_{th}$ is necessary.

Figure 40:
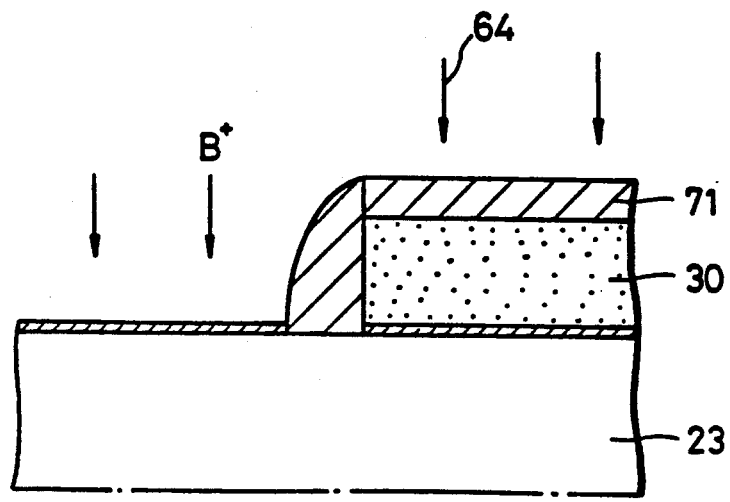
FIGS. 40 is a cross-sectional view of a main portion of the manufacturing-process according to the thirteenth embodiment of the present invention.

Incidentally, if the difference in concentration between the n-type low concentration regions 25c, 26c and the channel region 27 is made larger, an insulating film 71 made of SiO$_2$ or the like may be formed on the gate electrode 30 to provide a larger difference in level, as shown in FIG. 40, and the boron 64 may be ion-implanted in this condition. After the ion implantation, the insulating film 71 is removed. In this structure, the boron concentrations in the source region 25 and the drain region 26 become lower, thereby making it possible to further reduce the concentration of the n-type low concentration regions 25c, 26c.

Figure 41A:
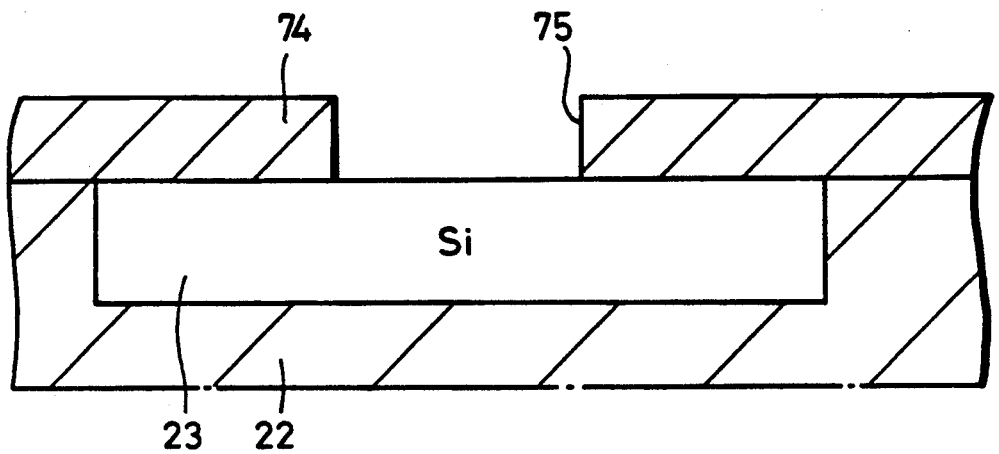
FIGS. 41A through 41H are diagrams used to explain another manufacturing-process of the thirteenth embodiment of the present invention, respectively.

Next, the example of FIGS. 41A through 41H will be described. After depositing an SiO$_2$ film 74 on a main surface of the silicon thin film 23 by CVD method, a portion of the SiO$_2$ film 74 corresponding to the channel region is selectively etched through a photoresist mask (not shown) by RIE (reactive ion etching) to form an opening 75, as shown in FIG. 41A.

Next, a sacrifice oxidization is performed for removing damage caused by the RIE to form a sacrifice oxide film of approximately 20 nm in thickness. Then, after removing the sacrifice oxide film by wet etching, a gate oxide film 29 is formed on the surface corresponding to the channel region, as shown in FIG. 41B.

Figure 41B:
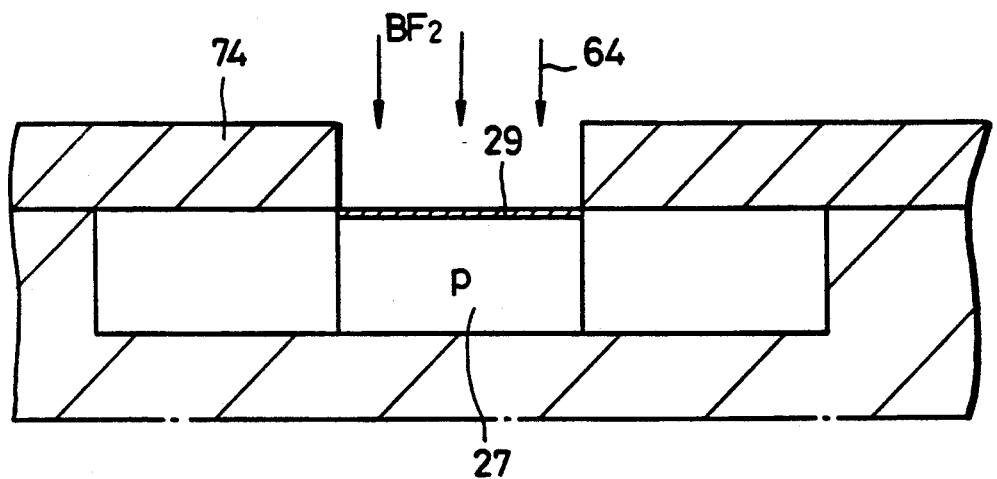

Next, as shown in FIG. 41B, boron 64, for example, $BF_2+$ is ion-implanted into the channel region 27 with the $SiO_2$ film 74 used as a mask for controlling the threshold voltage $V_{th}$ and for preventing the short channel effect, whereby the concentration of the channel region 27 becomes, for example, approximately $10^{17}$ cm$^{-3}$.

Figure 41C:
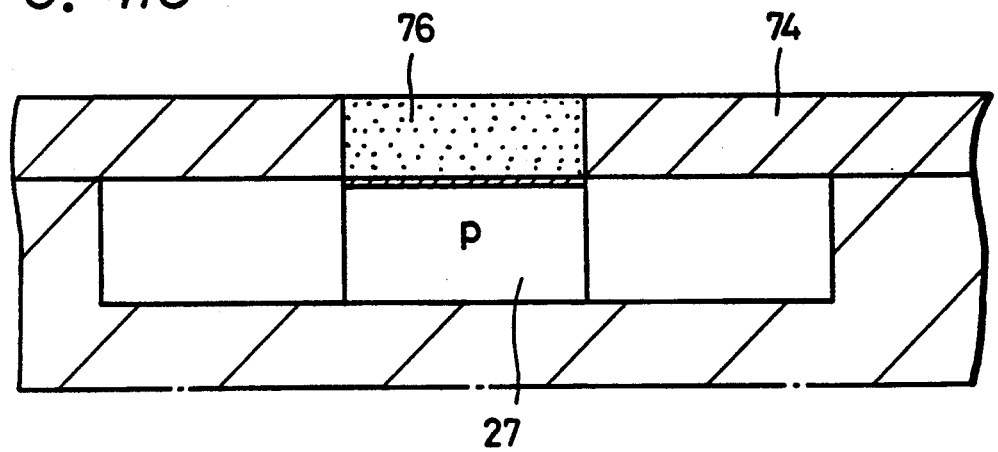
Figure 41D:
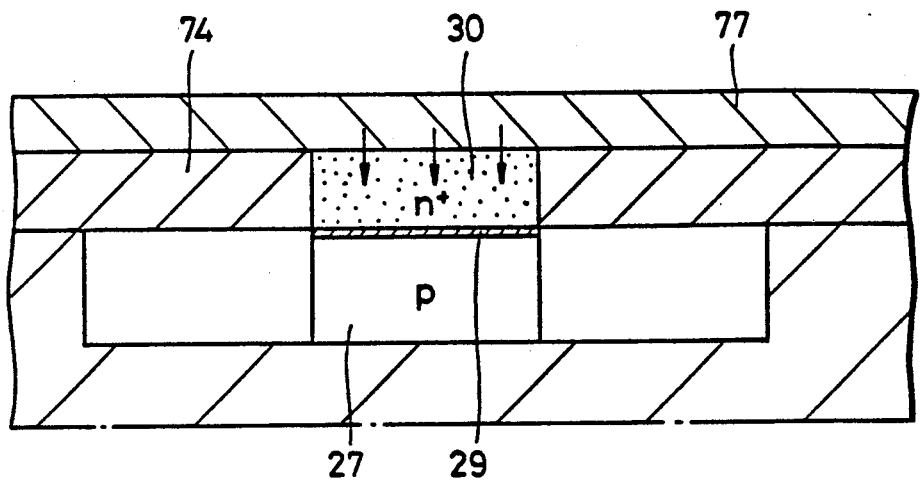

Next, as shown in FIG. 41C, polycrystalline silicon 76 is deposited in a manner that the opening 75 is filled with the same and etched back for planification. Then, as shown in FIG. 41D, after a PSG (phosphor silicate glass) film 77 is deposited, phosphor impurity is diffused from the PSG film 77 to the polycrystalline silicon film 76 to form a gate electrode 30 made of phosphor-doped polycrystalline silicon.

Figure 41E:
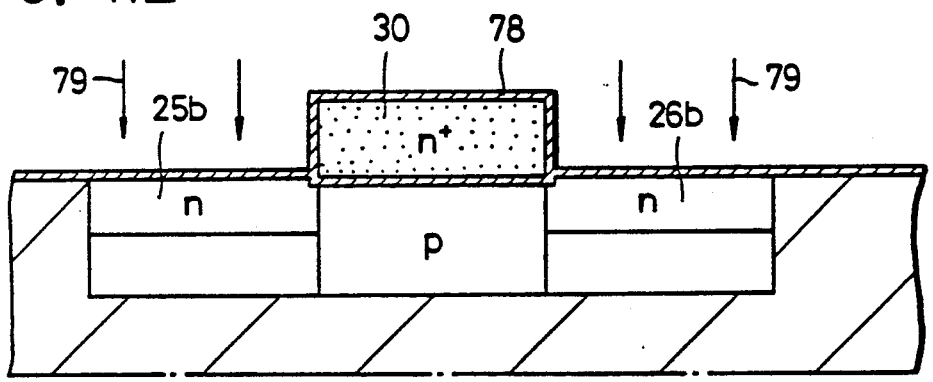

Next, the PSG film 77 and the CVD $SiO_2$ film 74 are removed by RIE, and subsequently a surface corresponding to the source region and drain region and the surface of the gate electrode 30 made of polycrystalline silicon are respectively oxidized to form an $SiO_2$ film 78, as shown in FIG. 41E.

Figure 41F:
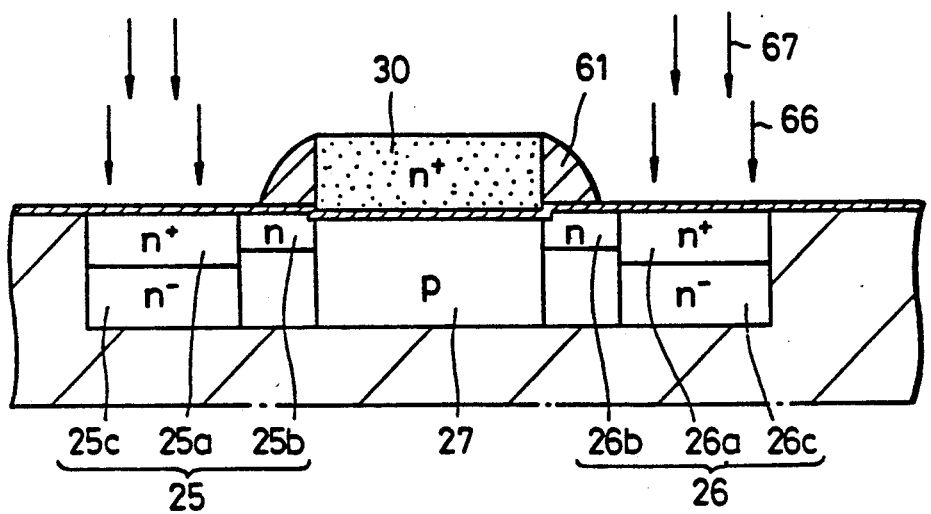

Next, as shown in FIG. 41E, n-type impurity 79 in a low concentration is ion-implanted with the gate electrode 30 used as a mask to form the LDD-structured n-type low concentration regions 25b, 26b. Then, as shown in FIG. 41F, side walls 61 of CVD $SiO_2$ are formed on both sides of the gate electrode 30, and n-type impurities 66 having a high energy and a relatively low concentration are ion-implanted with the gate electrode 30 and the side wall 61 used as masks to form the n-type low concentration regions 25c and 26c in a lower part of the silicon thin film. Also, n-type impurity 67 having a low energy and a relatively high concentration is ion-implanted to form the high concentration regions 25a and 26a in an upper part of the silicon thin film, thus forming the n-type source region 25 and drain region 26.

Figure 41G:
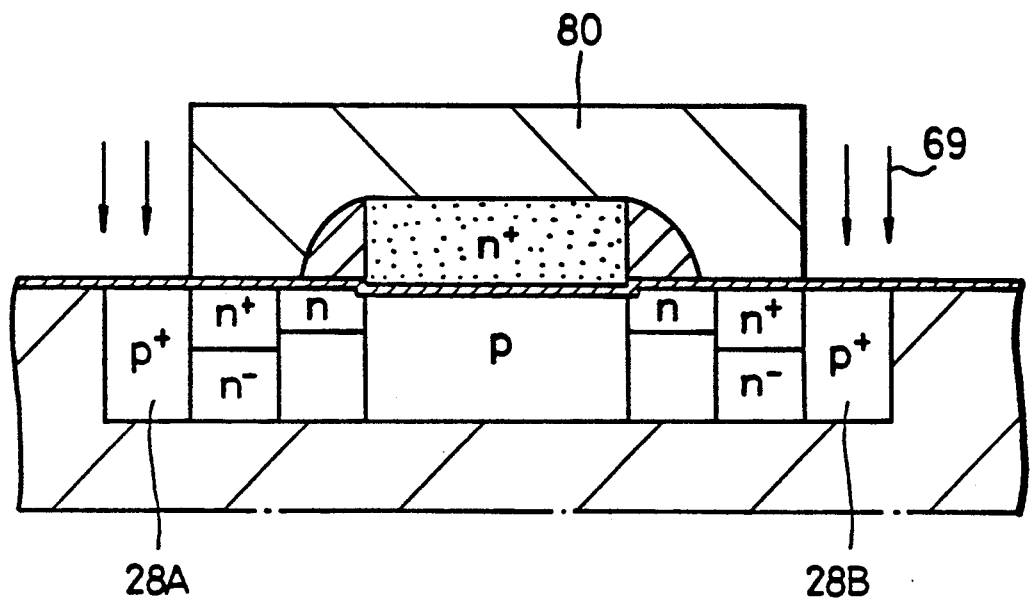
Figure 41H:
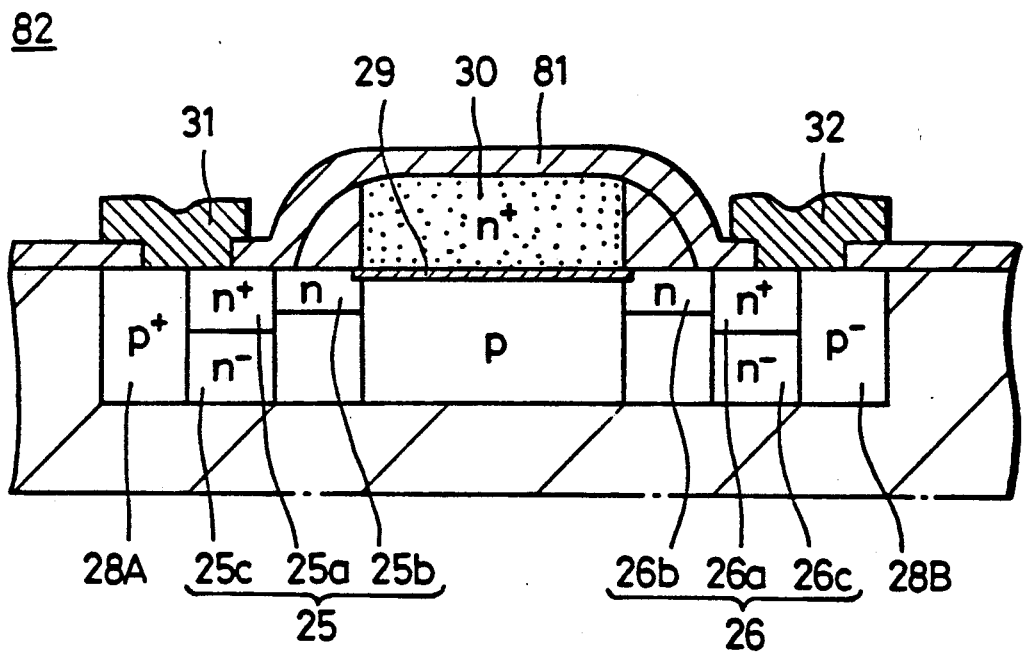

Next, p-type impurity 69 is ion-implanted, for example, through a resist mask 80 to form the p-type regions 28A and 28B outside the source region 25 and the drain region 26, respectively, as shown in FIG. 41G. Then, as shown in FIG. 41H, an $SiO_2$ film 81 is formed, and contact windows are formed through this film in which the source electrode 31 and the drain electrode 32 are formed to obtain an objective MISFET 82.

It is also possible, by the above-mentioned manufacturing method, to easily manufacture an MISFET having the n-type low concentration regions 25c, 26c in a concentration lower than the channel region 27. In the thirteenth embodiment shown in FIGS. 41A through 41H, the boron 64 is implanted only into the channel region 27, so that the implantation is possible even if there finally exists a large difference in concentration between the channel region 27 and the low concentration regions 25c, 26c.

Incidentally, in the manufacturing methods shown in FIGS. 38A to 38D and FIGS. 41A to 41H, the source electrode 31 and the drain electrode 32 may be formed by using the silicide film shown in FIGS. 29A through 29D.

Further, in the fourteenth embodiment shown in FIG. 19, there is employed an SOI substrate 24 comprising a silicon thin film 23 formed on a silicon substrate 21 through an $SiO_2$ film 22 which is insulated and separated in an insular shape. In the silicon thin film comprised in the SOI substrate 24, that is, the p-type silicon thin film 23, there are formed a first conductivity type or n-type source region 25 and a drain region 26 so as to reach the $SiO_2$ film 23 on the bottom of the SOI substrate. A metal layer 83 is also formed in the silicon thin film 23 outside the source region 25 such that it abuts on the source region 25 but it is separated from a channel region 27. In this case, the metal layer 83 is composed of a so-called ohmic metal which is in ohmic contact with the source region 25. The distance (width) $W_N$ of the source region 25 between the metal layer 83 and the channel region 27 is selected to be shorter than the diffusion length $L_p$ of the minority carrier or hole in the source region 25. On the channel region 27 between the source region 25 and the drain region 26, there is formed a gate electrode 30 made, for example, of polycrystalline silicon, through a gate insulating film 29 made, for example, of $SiO_2$ or the like. The metal layer 83 is used commonly as a source electrode while a drain electrode 32 is formed on the drain region 26 to constitute an n-channel MISFET 94.

Figure 20:
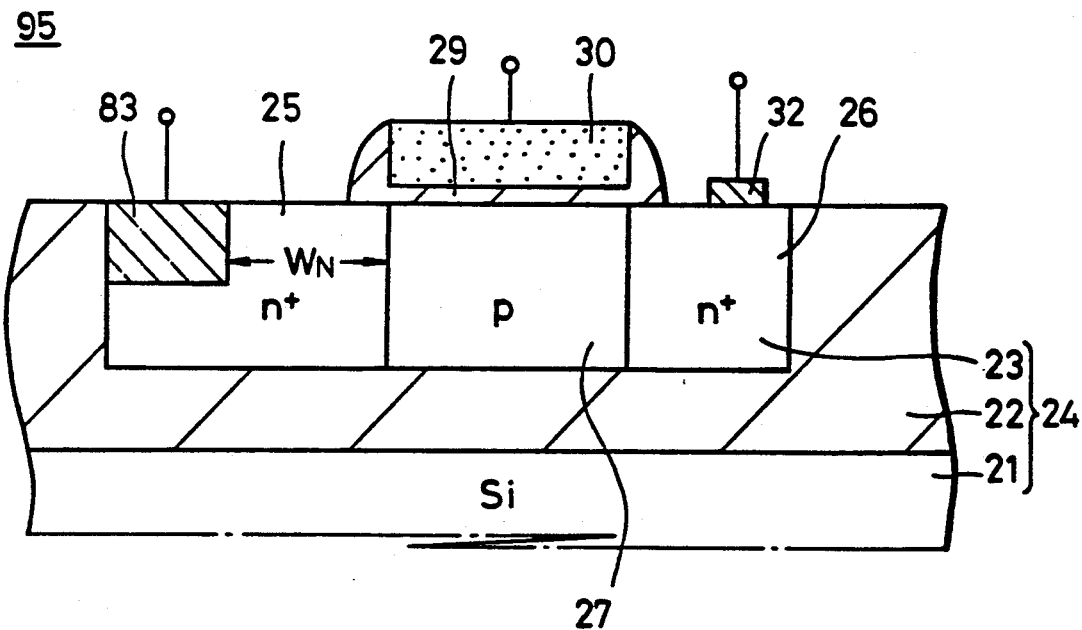
FIG. 20 is a schematic diagram showing a structure of a fifteenth embodiment of the MIS semiconductor device according to the present invention.
Figure 21:
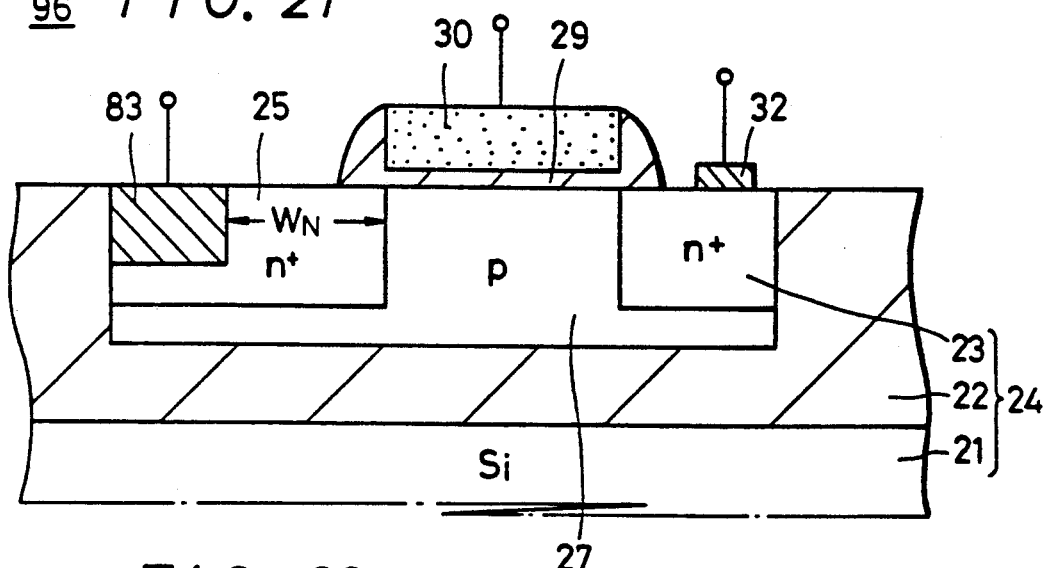
FIG. 21 is a schematic diagram showing a structure of a sixteenth embodiment of the MIS semiconductor device according to the present invention.
Figure 22:
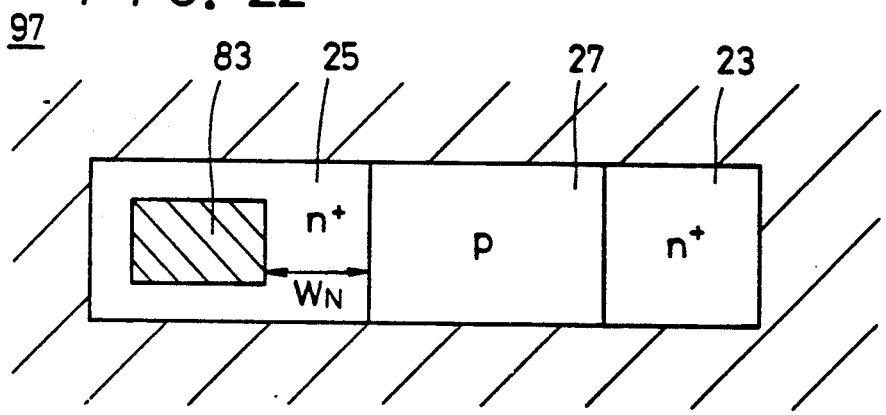
FIG. 22 is a schematic diagram showing a structure of a seventeenth embodiment of the MIS semiconductor device according to the present invention.

FIGS. 20 through 22 show fifteenth to seventeenth embodiments which are respectively modified examples of FIG. 19. In FIG. 20, the n-type source region 25 and drain region 26 are formed so as to reach the $SiO_2$ film 22 on the bottom of the SOI substrate, and the metal layer 83 is formed within the n-type source region 25. In FIG. 21, the n-type source region 25 and drain region 26 are formed with a depth which does not reach the $SiO_2$ film 22 on the bottom of the SOI substrate, and the metal layer 83 is formed within the n-type source region 25. Further, in FIG. 22, the metal layer 83 is formed in a portion of the n-type source region 25, shown in a plane view. In either case, the metal layer 83 is constituted of an ohmic metal, and the distance $W_N$ of the source region 25 is selected to be shorter than the diffusion length $L_p$ of the positive hole.

Figure 35:
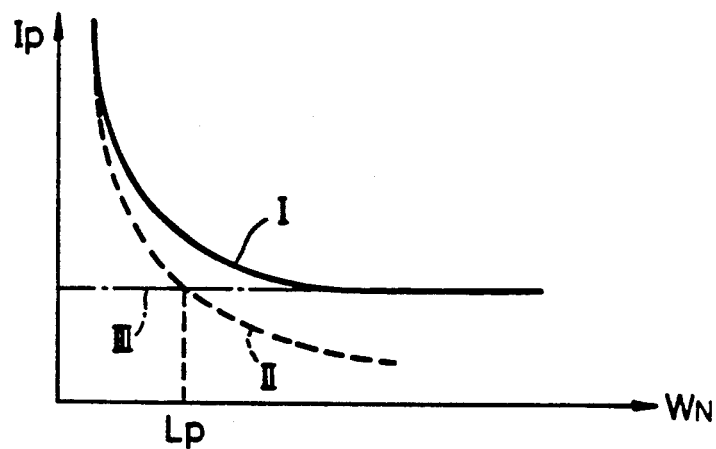
FIGS. 35, 36 and 37 are characteristic graphs used to explain the present invention, respectively.

When the positive holes of the electron-hole couplings generated by the impact ionization enter the source region 25, they flow toward the metal layer 83 by diffusion. FIG. 35 shows the dependence of a hole current $I_p$ flowing through the metal layer 83 upon the distance (width) $W_N$ of the source region 25. A curve II in FIG. 35 indicates a diffusion current of the hole, a curve III in FIG. 35 indicates a recombination current, and a curve I in FIG. 35 indicates the effective hole current $I_p$ obtained as the sum of the diffusion current and the recombination current. The diffusion current is proportional to $1/W_N$, whereby as the distance $W_N$ is increased beyond the diffusion length $L_p$ of the minority carrier (the positive hole in this case), the hole current $I_p$ becomes constant (or equal to the recombination current).

Thus, according to the MISFET 94 of the present embodiment, the metal layer 83 ohmically contacted with the source region 25 is formed within the silicon thin film 23, and the distance $W_N$ of the source region 25 between the metal layer 83 and the channel region 27 is made shorter than the diffusion length $L_p$ of the positive hole or the minority carrier, whereby the hole current Ip caused by the positive holes generated by the impact ionization and flowing toward the metal layer 83 is increased, and as the result the degradation of the breakdown voltage between the source and the drain can be suppressed.

Figure 23:
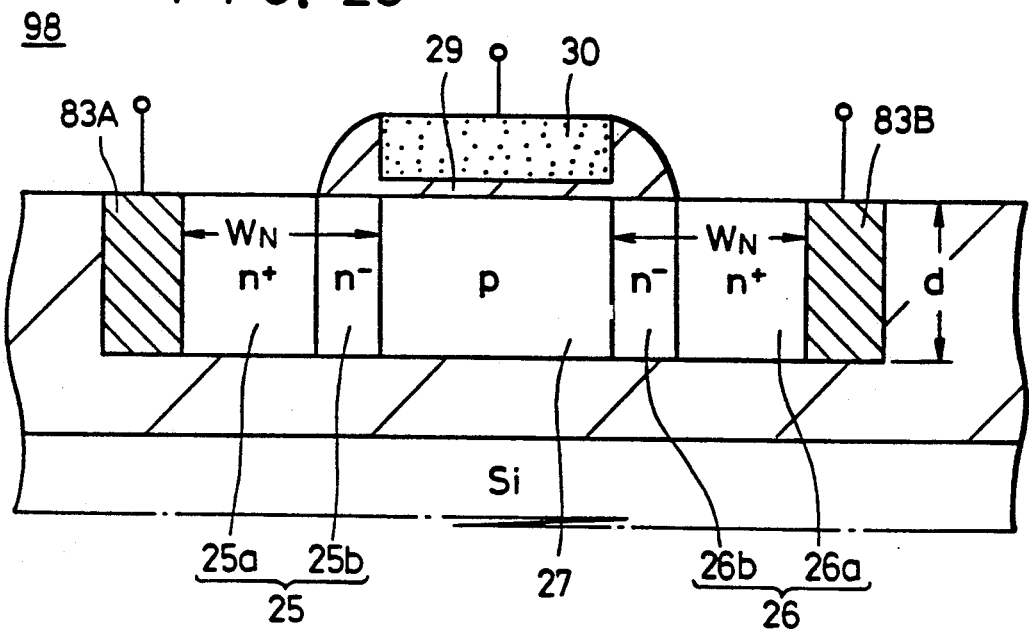
FIG. 23 is a schematic diagram showing a structure of an eighteenth embodiment of the MIS semiconductor device according to the present invention.

In the structures of the above-mentioned embodiments shown in FIGS. 19 to 22, it is possible to place the metal layer 83 symmetrically adjacent to both sides of the source region 25 and the drain region 26. FIG. 23 shows an example of a three-terminal LDD (Lightly doped drain) structure. This MISFET 98 has metal layers 83A and 83B respectively formed outside a source region 25 and a drain region 26 having high concentration regions 25a, 26a and low concentration regions 25b, 26b such that the metal layers are in ohmic contact with the corresponding source region 25 and drain region 26 but separated from a channel region 27. In this case, the effective distance $W_N$ of the symmetric source region 25 and drain region 26 are selected to be shorter than the diffusion length $L_p$ of the positive holes or the minority carrier. The metal layers 83A and 83B are used commonly as a source electrode and a drain electrode, respectively. Specifically, a gate electrode 30 is made, for example, of a boron-doped polycrystalline silicon, the thickness d of the silicon thin film 23 is selected to be 80 nm, the impurity concentration of the channel region 27 approximately $10^{14}$ cm$^{-3}$, the impurity concentration of the low concentration regions 25b and 26b of the source region and the drain region approximately $10^{17}$ cm$^{-3}$, and the impurity concentration of the high concentration regions 25a and 26a approximately $10^{20}$ cm$^{-3}$.

According to the MISFETs 94, 95, 96, 97 of the embodiments described above, it is possible to suppress the degradation of the breakdown voltage between the source and the drain due to the impact ionization. Further, since the metal layer 83 can be symmetrically formed on both sides of the source region 25 and the drain region 26, they can be used as a switching element such as an access transistor for a static RAM cell, thereby making it possible to extend an applicable range in circuit elements.

Also, the structure is simple because the metal layer 83 is merely formed outside the source region or outside the source region and the drain region, thereby providing a simple manufacturing process.

Further, the devices thus structured will not damage advantages of elements utilizing the SOI substrate such as a small parasitic capacitance, a large freedom in setting the impurity concentration in the channel region 27, and a high durability against $\alpha$ rays and latch-up.

Figure 24:
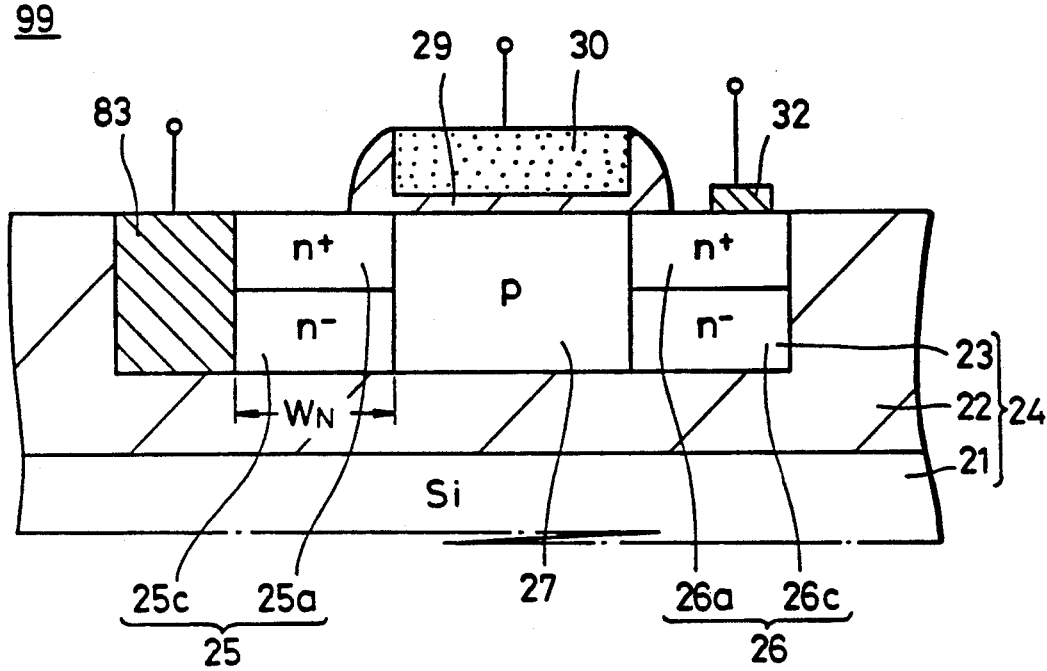
FIG. 24 is a schematic diagram showing a structure of a nineteenth embodiment of the MIS semiconductor device according to the present invention.

In the nineteenth embodiment shown in FIG. 24, in a silicon thin film 23, for example, of p-type, comprised in an SOI substrate 24, there are formed n-type source region 25 and drain region 26 respectively having high concentration regions 25a and 26a and low concentration regions 25c and 26c, formed beneath the high concentration regions, reaching an SiO$_2$ film 22 on the bottom, and a metal layer 83 is formed adjacent to the high concentration region 25a and the low concentration region 25c of the source region 25 but separated from the channel region 27. The metal layer 83 is contacted with the high concentration region 25a in an ohmic fashion, while a Schottky junction is formed between the metal layer 83 and the low concentration region 25c. The distance $W_N$ of the low concentration region 25c of the source region between the metal layer 83 and the channel region 27 is selected to be shorter than the diffusion length $L_p$ of the positive holes. Then, on the channel region 27 between the source region 25 and the drain region 26, there is formed a gate electrode 30 made, for example, of polycrystalline silicon through a gate insulating film 29 made of SiO$_2$ or the like, the metal layer 83 is used commonly as a source electrode, and a drain electrode 32 is formed on the high concentration region 26a of the drain region 26, to thereby constitute a MISFET 99.

Figure 36:
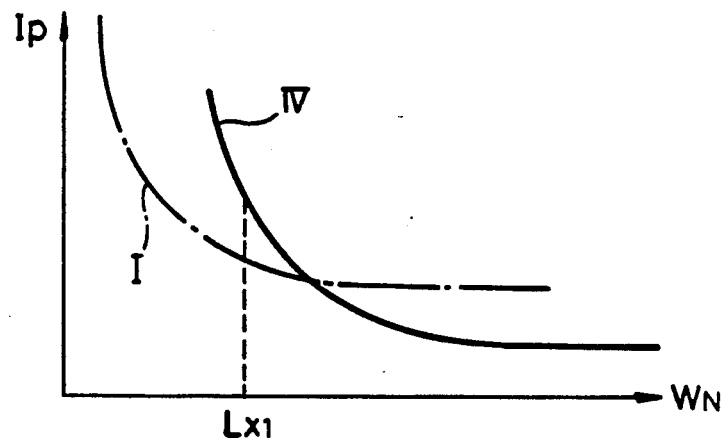
Figure 37:
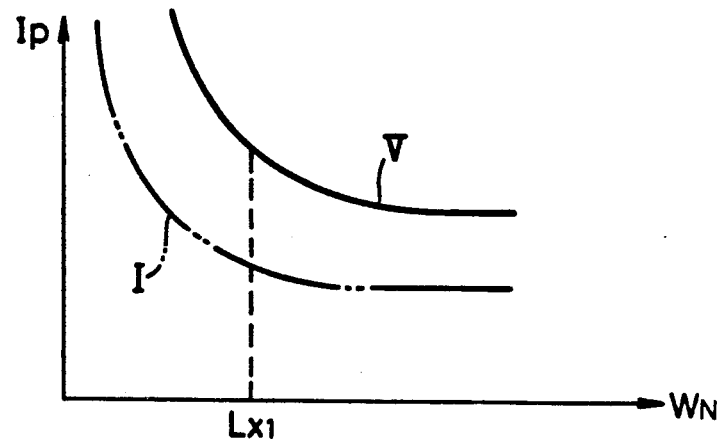

In the structure described above, the low concentration region 25c is formed in the source region 25 and the metal layer 83 forming a Schottky junction with the low concentration region 25c is provided, whereby the channel region 27, the source region 25c and the metal layer 83 correspond to the emitter, the base and the collector, respectively, and operate as a so-called bipolar transistor. Therefore, a hole current $I_p$ directing to the metal layer 83 is further increased compared with the above-mentioned embodiments, thereby making it possible to further suppress the degradation of the breakdown voltage between the source and the drain by the impact ionization. In other words, by forming the low concentration region 25c, a potential barrier formed between it and the channel region 27 for the positive hole is reduced, which results in increasing the diffusion length $L_p = \sqrt{D_p \tau}$ (where $D_p$ represent the diffusion coefficient of the minority carrier, and $\tau$ a life time of the minority carrier). Further, since there is also generated a recombination current, as explained with reference to FIG. 35, the hole current $I_p$, in this embodiment, is as the result increased in a minute region of $W_N$ as indicated by a curve IV of FIG. 36. Further, due to the Schottky junction formed between the metal layer 83 and the low concentration region 25c, the positive holes are further attracted to the metal layer 83 by a drift electric field prevailing in the Schottky junction, which leads to a shift of the $I_p$ curve as indicated by a curve V of FIG. 37. That is, the current $I_p$, which becomes equal to the sum of the diffusion current and a drift current, is increased so that the degradation of the breakdown voltage between the source and the drain is further suppressed.

In the above described operation, the expression which shows a drain current $I_D$ is shown again as follows:

$$I_D = \frac{(1 + K(V_D))I_c}{\left(1 - \frac{D_n W_N N_D}{D_p L N_A} K(V_D)\right)}$$

It will be understood from the above equation that as the concentration $W_D$ and the width $W_N$ of the low concentration region 25c of the source region are made smaller, the drain current $I_D$ becomes smaller and accordingly the breakdown voltage between the source and the drain is increased.

Also in this embodiment, similarly to FIG. 19, the source region and the drain region may be symmetrically provided without damaging the aforementioned variety of advantages of the element utilizing the SOI substrate.

Figure 25:
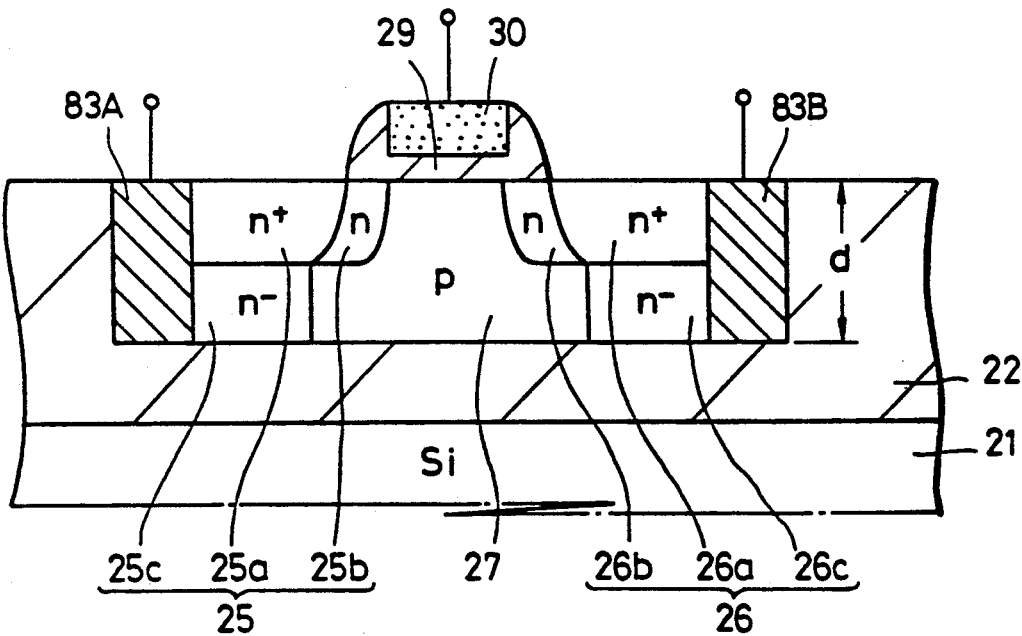
FIG. 25 is a schematic diagram showing a structure of a twentieth embodiment of the MIS semiconductor device according to the present invention.

FIG. 25 shows the twentieth embodiment having a symmetric structure on the source region side and the drain region side. This structure is provided by forming n-type source region 25 and drain region 26 having high concentration regions 25a, 26a and low concentration regions 25b, 26b of LDD, respectively, in a p-type silicon thin film 23 and other low concentration regions 25c, 26c beneath the high concentration regions 25a, 26a, respectively, adjacent to the channel region 27. Further, metal layers 83A, 83B are formed such that they are respectively in contact with the low concentration regions 25c, 26c and the high concentration regions 25a, 26a but separated from the channel region 27. In this structure, the metal layers 83A, 83B are ohmically contacted with corresponding high concentration regions 25a, 26a, respectively, while Schottky junctions are formed between the metal layers 83A, 83B and the corresponding low concentration regions 25c, 26c. The metal layers 83A and 83B are used commonly as a source electrode and a drain electrode, respectively.

A gate electrode 30 is made, for example, of phosphor-doped polycrystalline silicon. The thickness d of the silicon thin film 23 is selected to be 1500 Å, the impurity concentration of the p-channel region 27 approximately $10^{17}$ cm$^{-3}$, the impurity concentration of the high concentration regions 25a and 26a of the source region and the drain region approximately $10^{20}$ cm$^{-3}$, the impurity concentration of the low concentration regions 25b and 26b of LDD approximately $10^{18}$ cm$^{-3}$, and the impurity concentration of the low concentration regions 25c and 26c approximately $10^{15}$-$10^{16}$ cm$^{-3}$.

Since the source and drain can be symmetrically formed as described above, the element of the present embodiment can be used as a switching element such as an access transistor for a static RAM cell.

FIGS. 26A through 26F shows the twenty-first embodiment of the present invention which will be described with a manufacturing process thereof.

Figure 26A:
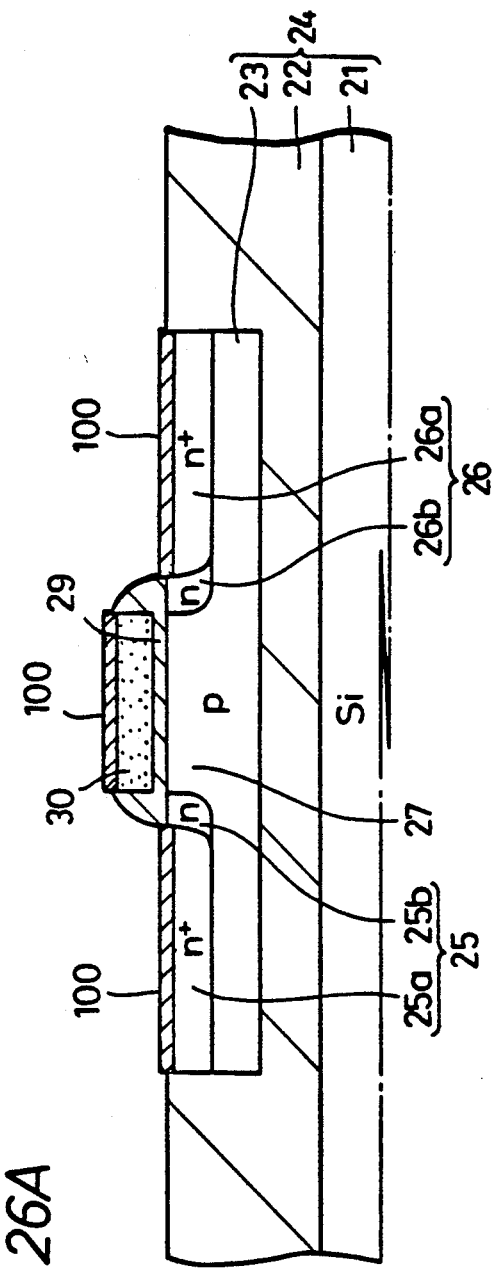

As shown in FIG. 26A, in this embodiment, a gate insulating film 29 made of SiO$_2$ or the like and a gate electrode 30 made of polycrystalline silicon are formed in a silicon thin film 23 comprised in an SOI substrate 24. Then, LDD-structured n-type source region 25 and drain region 26 having low concentration regions 25b, 26b and high concentration regions 25a, 26a are formed such that the source region 25 and the drain region 26 provide shallow junctions. Further, on the surfaces of the high concentration regions 25a and 26a of the source region and the drain region and the surface of the gate electrode 30, there are formed a silicide layers made of high melting point metal, for example, titanium silicide (TiSi$_2$) layer 100.

Figure 26B:
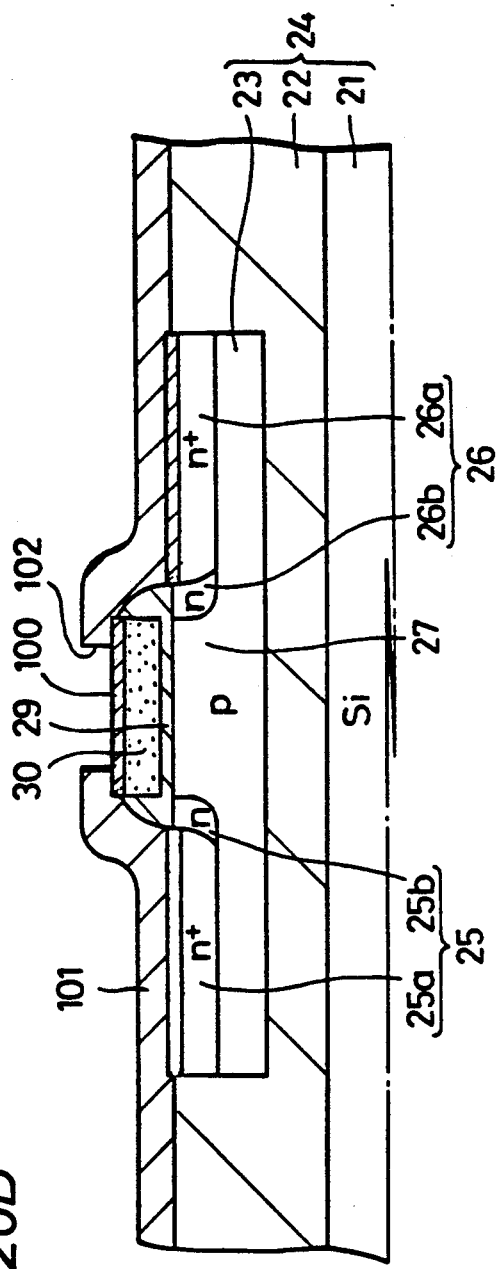
Figure 26C:
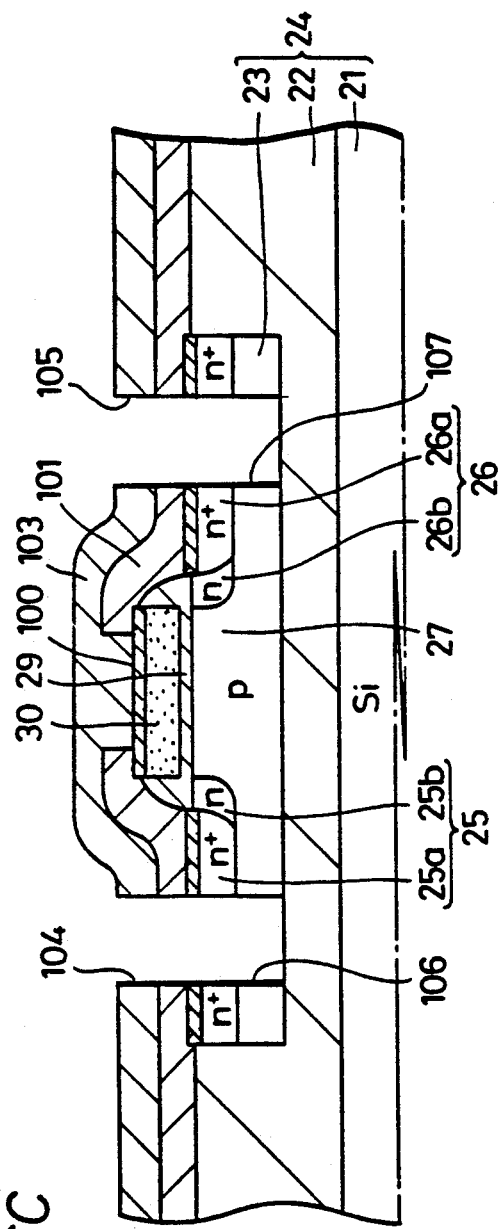

Next, as shown in FIG. 26B, an inter-layer insulating film 101 is formed and a window 102 for exposing a gate contact portion is formed. Then, as shown in FIG. 26C, windows 104 and 105 corresponding to a source contact portion and a drain contact portion, respectively, are formed through a photo-resist mask 103. Further, grooves 106 and 107 are formed by selectively etching the silicon portions through the windows 104 and 105 to a depth reaching the SiO$_2$ film 22 on the bottom of the film 23.

Figure 26D:
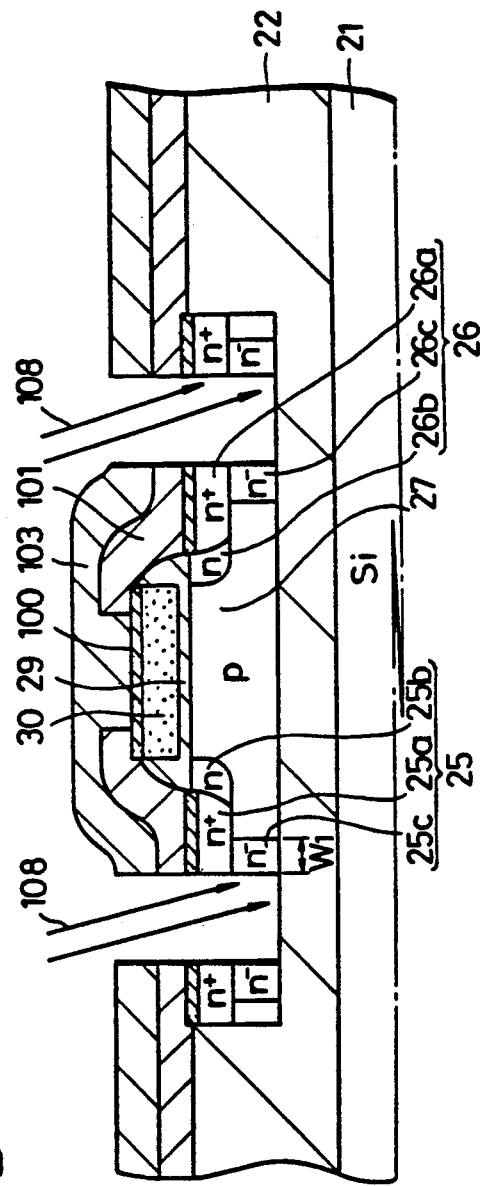

Next, as shown in FIG. 26D, an n-type impurity 108 of a low concentration is ion-implanted with a predetermined implanting angle to form n-type low concentration regions 25c and 26c reaching the SiO$_2$ film 22 on the bottom immediately beneath the high concentration regions 25a and 26b of the source region and the drain region. In this event, the width W$_1$ (corresponding to W$_N$) of the low concentration regions 25c and 26c is made sufficiently shorter than the diffusion length L$_p$ of the minority carrier (W$_N$<<L$_p$) The width W$_1$ can be controlled by an implanting angle at the time of the ion implantation, an implanting energy, and a subsequent anneal processing.

Next, as shown in FIG. 26E, a film 109 made, for example, of Ti, which is a refractory metal, is deposited on the inner surfaces of the grooves 106 and 107 and annealed to form titanium silicide (TiSi$_2$) films 110 on the inner walls of the grooves 106 and 107, that is, on the respective surfaces of the high concentration regions 25a, 26a and the low concentration regions 25c, 26c of the source region 25 and the drain region 26. The titanium silicide films 110 are ohmically contacted with the high concentration regions 25a, 26a and form Schottky junctions with the low concentration regions 25c, 26c.

Thereafter, as shown in FIG. 26F, Al films 112 are formed in the respective grooves 106 and 107 and on the gate electrode 30 through barrier metal, for example, TiON films 111, and then a source electrode 31, a drain electrode 32 and a gate lead-out electrode 113 are formed by the patterning-process, to thereby obtain a target MISFET 114. In this structure, metal layers 83A and 83B are composed of the titanium silicide films 110, the barrier metal films 111 and the Al films 112.

According to the thus constructed MISFET 114, it is possible to provide the n-type low concentration regions 25c, 26c sufficiently narrower than the diffusion length L$_p$ of the minority carrier (W$_N$<<L$p$) so that a hole current I$_p$ flowing to the metal layer 83A is increased. Simultaneously, by virtue of the Schottky junction formed between the metal layer 83A and the low concentration region 25c, a drift current based on an electric field prevailing at the Schottky junction is generated in addition to a diffusion current, whereby the hole current I$_p$ is further increased. It is therefore possible to further improve the breakdown voltage between the source and the drain as compared with the foregoing respective embodiments.

Also, in the manufacturing process, it is possible to form the low concentration region 25c in a remarkably narrow width. Further, the element of the present embodiment can be readily manufactured only by adding a process for forming the grooves 106 and 107.

Figure 27A:
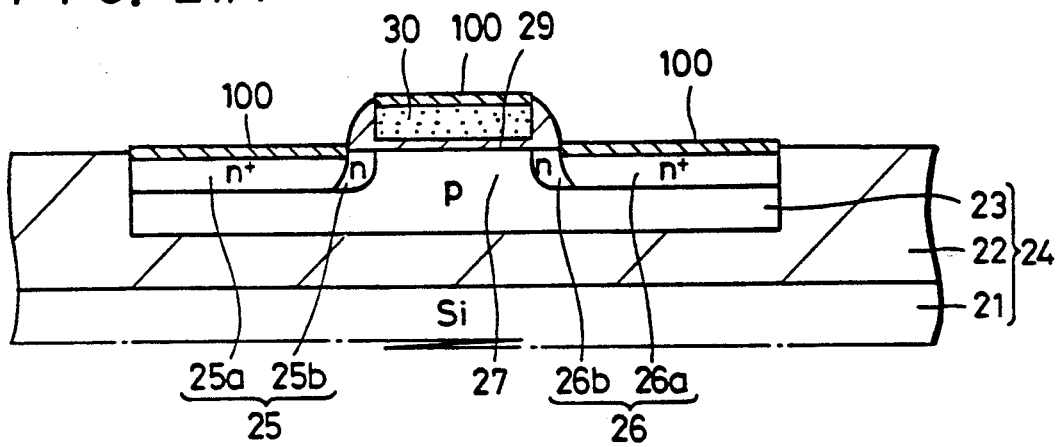
FIGS. 27A to 27E are schematic diagrams to which references will be made in explaining a manufacturing-process of a twenty-second embodiment of the MIS semiconductor device according to the present invention, respectively.

FIGS. 27A through 27E show the twenty-second embodiment which is a modified example of FIGS. 26A through 26F. As shown in FIG. 27A, in this embodiment, in a silicon thin film 23 comprised in an SOI substrate 24 there are formed a gate insulating film 29, a gate electrode 30 made of polycrystalline silicon, n-type source region 25 and drain region 26 respectively composed of high concentration regions 25a, 26a and low concentration regions 25b, 26b. Further, for example, a titanium silicide film 100 is formed over the whole surfaces of the source region 25, the drain region 26 and the gate electrode 30.

Figure 27B:
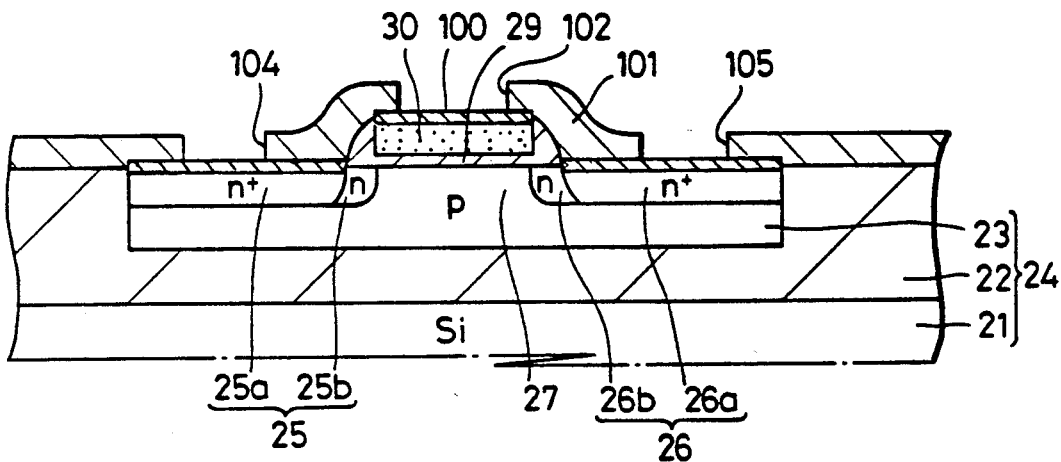

Next, as shown in FIG. 27B, an inter-layer insulating film 101 is formed and at the same time, windows 102, 104 and 105 to which the gate contact portion, the source contact position and the drain contact portion of the inter-layer insulating film 101 faces, respectively are formed.

Figure 27C:
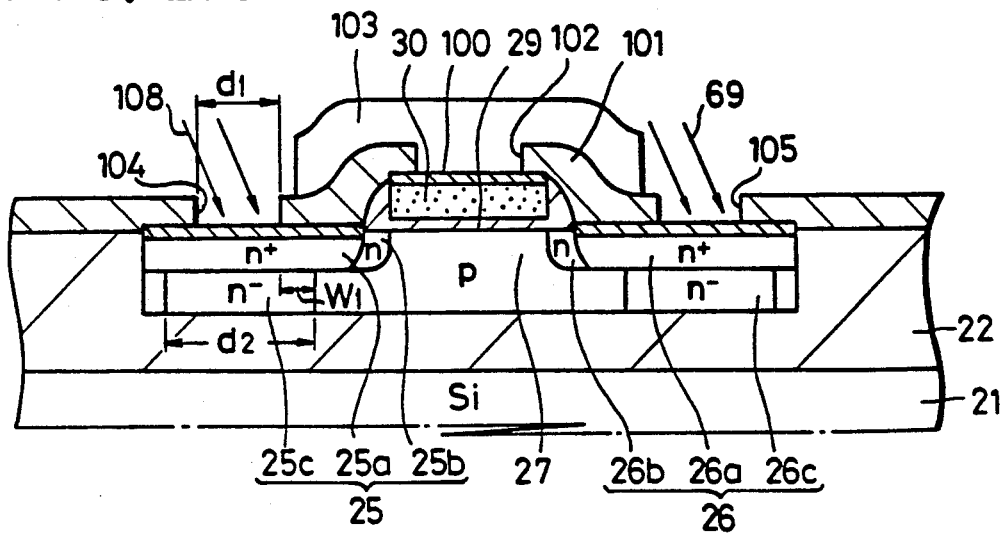

Next, as shown in FIG. 27C, n-type impurities 108 of a low concentration is ion-implanted with a predetermined implanting angle through an ion implanting mask, for example, a photo-resist mask 103 and windows 104, 105 to form n-type low concentration regions 25c, 26c reaching an SiO$_2$ film 22 on the bottom immediately beneath the high concentration regions 25a, 26a of the source region and the drain region. In this case, the width d$_2$ of the low concentration regions 25c, 26c is made wider than the width d$_1$ of the windows 104, 105, wherein the difference W$_1$ therebetween (corresponding to W$_N$) can be controlled by an implanting angle at the time of ion implantation, an implanting energy and a subsequent annealing processing.

Figure 27D:
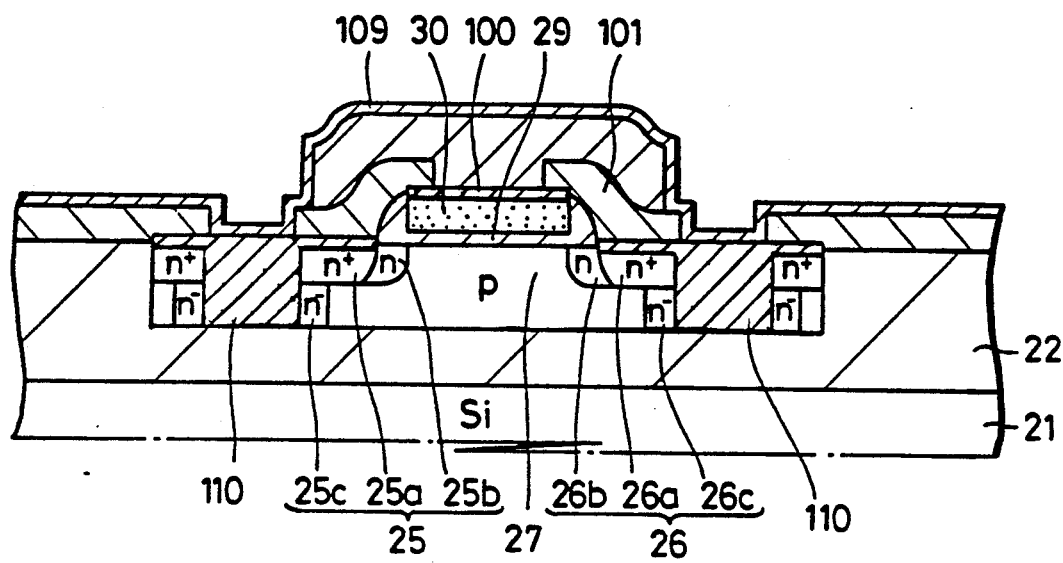

As shown in FIG. 27D, the surfaces exposing through the windows 104, 105 are deposited with a film 109 made of a high melting point metal, for example, Ti, and annealed to exert a reaction between titanium and silicon to a depth reaching the $SiO_2$ film 22 on the bottom to form titanium silicide ($TiSi_2$) films 110 adjacent to the high concentration regions 25a, 26a and the low concentration regions 25c, 26c.

Figure 27E:
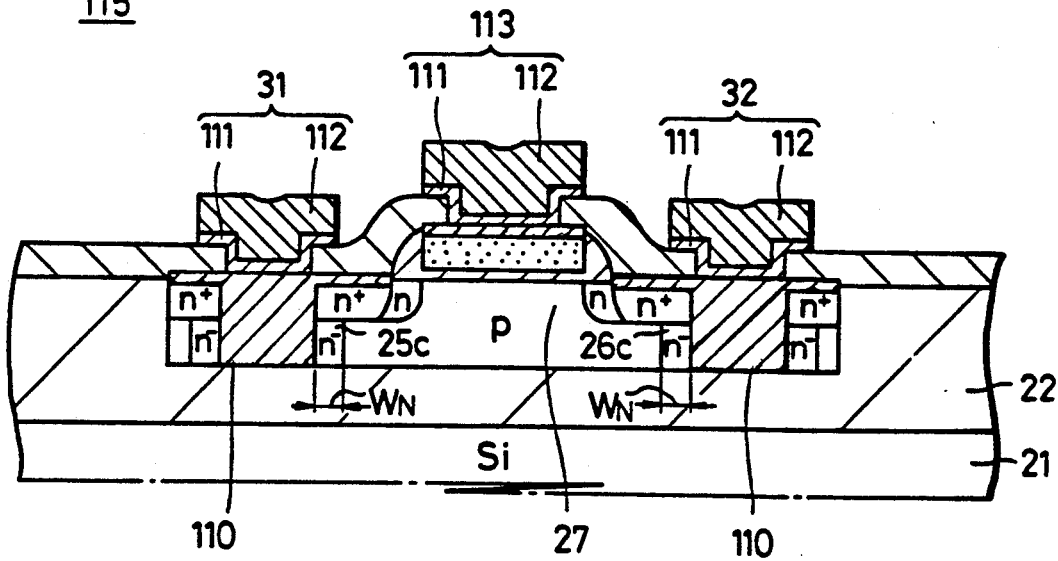

Next, as shown in FIG. 27E, after removing the Ti film 109 which has not been reacted and the photo-resist mask 103, a TiON film 111 serving as a barrier metal and an Al film 112 are formed and patterned to form a source electrode 31, a drain electrode 32 and a gate lead-out electrode 113, thereby obtaining a target MISFET 115.

Also in the thus constructed MISFET 115, the low concentration region 25c is formed to be sufficiently narrower than the diffusion length $L_p$ of the minority carrier ($W_N < < L_p$), and a Schottky junction is formed by the titanium silicide film 110, thereby making it possible to improve the drain breakdown voltage similarly to FIGS. 26A through 26F. In addition, the embodiment of FIGS. 27A through 27E can form the windows 104 and 105 for the source contact and the drain contact simultaneously with the window 102 for the gate contact and need not form the grooves 106, 107, which results in the simplified manufacturing-process as compared with the embodiment shown in FIGS. 26A to 26F.

Figure 28:
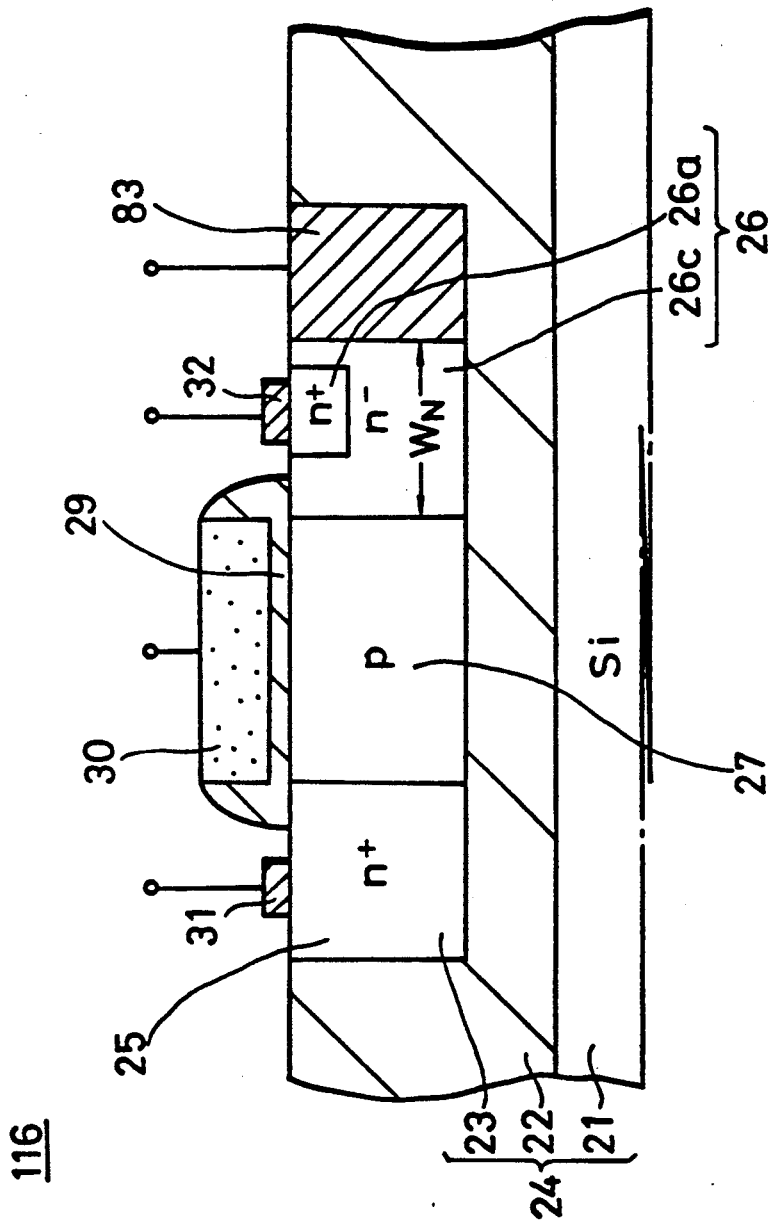
FIG. 28 is a schematic diagram showing a structure of a twenty-third embodiment of the MIS semiconductor device according to the present invention, respectively.

FIG. 28 shows the twenty-third embodiment. As shown in FIG. 28, in a silicon thin film 23 of, for example, p-type comprised in an SOI substrate 24, there are formed an n-type source region 25 of a high concentration and a drain region 26 having a high concentration region 26a within a low concentration region 26c to face the surface. Further, a metal layer 83 is formed adjacent to the outside of the low concentration region 26c of the drain region 26 but separated from the channel region 27. A Schottky junction is formed between the metal layer 83 and the low concentration region 26c. The distance $W_N$ of the drain region 26c between the metal layer 83 and the channel region 27 is selected to be shorter than the diffusion length $L_p$ of the positive hole or the minority carrier. Then, a gate electrode 30 made, for example, of polycrystalline silicon is formed on the channel region 27 between the source region 25 and the drain region 26 through a gate insulating film 29 made of $SiO_2$ or the like, while a source electrode 31 and a drain electrode 32 are formed on the source region 25 and the drain region 26, respectively, to form a MISFET 116. In this structure, it is necessary to provide the metal layer 83 with a potential identical to the potential of the source or potential of its vicinity. That is, the potential of the metal layer 83 should be lower than that of the channel region.

According to the thus constructed MISFET 116, the metal layer 83 for forming a Schottky junction with the drain region 26 is provided on the side of the drain region 26 close to the source of electron-positive hole couplings generated by the impact ionization, whereby the positive holes generated by the impact ionization can be released through the drain region 26 and the metal layer 83 by an action similar to described above to improve the breakdown voltage between the source and the drain.

Having described the preferred embodiments of the invention with reference to the accompanying drawings, it is to be understood that the invention is not limited to those precise embodiments and that various changes and modifications thereof could be effected by one skilled in the art without departing from the spirit or scope of the novel concepts of the invention as defined in the appended claims.

What is claimed is:

1. A semiconductor device (51) comprising:
   a substrate (21);
   an insulating layer (22) formed on said substrate;
   a semiconductor layer (23) forming a source region (25), a drain region (26), a channel region (27) and a lead-out region (28) wherein said source region comprises a high concentration source region (25a) and a low concentration source region (25c) formed beneath said high concentration source region, and said drain region comprises a high concentration drain region (26a) and a low concentration drain region (26c) formed beneath said high concentration drain region, said lead-out region having a conductivity type which is the same as that of said channel region, said lead-out region being separated from said channel region and formed adjacent to said source region but separate from said channel region; and
   a gate electrode (30) formed on said semiconductor layer above said channel region through a gate insulating film (29).

2. A semiconductor device (52) comprising:
   a substrate (21);
   an insulating layer (22) formed on said substrate;
   a semiconductor layer (23) forming a source region (25), a drain region (26), a channel region (27) and a lead-out region (28a) wherein said source region comprises a high concentration source region (25a) and a first low concentration source region (25b), which is formed between said high concentration source region and said channel region, and a second low concentration source region (25c) formed beneath said high concentration source region and said drain region comprises a high concentration drain region (26a) and a first low concentration drain region (26b), which is formed between said high concentration drain region and said channel region, and a second low concentration drain region (26c) formed beneath said high concentration drain region, said lead-out region having a conductivity type which is the same as that of said channel region said lead-out region being separated from said channel region and being formed adjacent to said source region but separated from said channel region; and
   a gate electrode (30) formed on said semiconductor layer above said channel region through a gate insulating film (29).

3. A semiconductor device (52) comprising:
   a substrate (21);
   an insulating layer (22) formed on said substrate;
   a semiconductor layer (23) forming a source region (25), a drain region (26), a channel region (27) and a first lead-out region (28B) wherein said source region comprises a high concentration source region (25a) and a first low concentration source region (25b), which is formed between said high concentration source region and said channel region, and a second low concentration source region (25c) formed beneath said high concentration source region, and said drain region comprises a high concentration drain region (26a) and a first low concentration drain region (26b), which is formed between said high concentration drain region and said channel region, and a second low concentration drain region (26c) formed beneath said high concentration drain region, and said first lead-out drain region and said second lead-out region have conductivity types which are the same as that of said channel region and are separated from said channel region and are respectively formed adjacent to said source region and said drain region but are separated from said channel region; and a gate electrode (30) formed on said semiconductor layer above said channel region through a gate insulating film (29).

4. A semiconductor device (59) comprising:
a substrate (21);
an insulating layer (22) formed on said substrate;
a semiconductor layer (23) forming a source region (25), a drain region (26), a channel region (27) and a first lead-out region (28A) having a conductivity type which is the same as that of said channel region and a second lead-out region (28B) having a conductivity type which is the same as that of said channel region, wherein said source region has a low concentration source region (25b) between said channel region and a high concentration source region (25a), and said drain region has a low concentration drain region (26b) between said channel region and said first lead-out region and said second lead-out region are respectively formed adjacent to said source region and said drain region but are separated from said channel region;

a gate electrode (30) formed on said semiconductor layer above said channel region through a gate insulating film (29);

a barrier metal (58) formed on an area covering said high concentration source region and said first lead-out region and on an area covering said drain region and said second lead-out region.

5. A semiconductor device according to claim 4 wherein said gate electrode is covered with barrier metal.

* * * * *